US008865492B2

(12) United States Patent
Jorgenson et al.

(10) Patent No.: US 8,865,492 B2
(45) Date of Patent: Oct. 21, 2014

(54) METHOD OF FORMING CURRENT-INJECTING/TUNNELING LIGHT-EMITTING DEVICE

(75) Inventors: Robbie J. Jorgenson, San Diego, CA (US); David J. King, Eagan, MN (US)

(73) Assignee: Lightwave Photonics, Inc., Encinitas, CA (US)

( * ) Notice: Subject to any disclaimer, the term of this patent is extended or adjusted under 35 U.S.C. 154(b) by 586 days.

(21) Appl. No.: 12/956,640

(22) Filed: Nov. 30, 2010

(65) Prior Publication Data

US 2011/0244609 A1 Oct. 6, 2011

Related U.S. Application Data

(62) Division of application No. 12/393,029, filed on Feb. 25, 2009, now Pat. No. 7,842,939.

(60) Provisional application No. 61/066,960, filed on Feb. 25, 2008.

(51) Int. Cl.
*H01L 33/60* (2010.01)
*H01L 21/20* (2006.01)
*H01L 33/40* (2010.01)
*H01L 33/10* (2010.01)
*H01L 33/06* (2010.01)
*H01L 33/04* (2010.01)

(52) U.S. Cl.
CPC ............ *H01L 33/105* (2013.01); *H01L 33/405* (2013.01); *H01L 33/06* (2013.01); *H01L 33/04* (2013.01)
USPC .... 438/29; 438/478; 257/E33.06; 257/E21.09

(58) Field of Classification Search
USPC .................. 438/29, 478; 257/E33.06, E21.09
See application file for complete search history.

(56) References Cited

U.S. PATENT DOCUMENTS

| 4,780,749 A | 10/1988 | Schulman |
| 5,557,627 A | 9/1996 | Schneider et al. |

(Continued)

FOREIGN PATENT DOCUMENTS

| JP | 1997232631 | 9/1997 |
| JP | 1998321954 | 12/1998 |

(Continued)

OTHER PUBLICATIONS

Chen, N.C., et al., "Nitride light-emitting diodes grown on Si (111) using a TiN template", "Applied Physics Letters", May 10, 2006, pp. 191110-1-191110-3, vol. 88, No. 191110.

(Continued)

*Primary Examiner* — Long Pham
(74) *Attorney, Agent, or Firm* — Charles A. Lemaire; Lemaire Patent Law Firm, P.L.L.C.

(57) ABSTRACT

An apparatus and method for making same. Some embodiments include a light-emitting device having a light-emitting active region; a tunneling-barrier (TB) structure facing adjacent the active region; a TB grown-epitaxial-metal-mirror (TB-GEMM) structure facing adjacent the TB structure, wherein the TB-GEMM structure includes at least one metal is substantially lattice matched to the active region; and a conductivity-type III-nitride crystal structure adjacent facing the active region opposite the TB structure. In some embodiments, the active region includes an MQW structure. In some embodiments, the TB-GEMM includes an alloy composition such that metal current injectors have a Fermi energy potential substantially equal to the sub-band minimum energy potential of the MQW. Some embodiments further include a second mirror (optionally a GEMM) to form an optical cavity between the second mirror and the TB-GEMM structure. In some embodiments, at least one of the GEMM is deposited on, and lattice matched to, a substrate.

24 Claims, 11 Drawing Sheets

(56) References Cited

U.S. PATENT DOCUMENTS

| | | |
|---|---|---|
| 5,619,059 A | 4/1997 | Li et al. |
| 5,966,393 A | 10/1999 | Hide et al. |
| 6,045,626 A | 4/2000 | Yano et al. |
| 6,100,545 A | 8/2000 | Chiyo et al. |
| 6,420,199 B1 | 7/2002 | Coman et al. |
| 6,426,512 B1 | 7/2002 | Ito et al. |
| 6,531,719 B2 | 3/2003 | Shibata et al. |
| 6,563,141 B1 | 5/2003 | Dawson et al. |
| 6,573,537 B1 | 6/2003 | Steigerwald et al. |
| 6,589,808 B2 | 7/2003 | Chiyo et al. |
| 6,614,060 B1 | 9/2003 | Wang et al. |
| 6,784,085 B2 | 8/2004 | Cuomo et al. |
| 6,800,500 B2 | 10/2004 | Coman et al. |
| 6,872,965 B2 | 3/2005 | Ito et al. |
| 6,929,867 B2 | 8/2005 | Armitage et al. |
| 6,943,377 B2 | 9/2005 | Gaska et al. |
| 6,969,874 B1 | 11/2005 | Gee et al. |
| 7,030,417 B2 | 4/2006 | Ishibashi et al. |
| 7,148,520 B2 | 12/2006 | Yoo |
| 7,176,483 B2 | 2/2007 | Grupp et al. |
| 7,215,692 B2 | 5/2007 | Jewell |
| 7,223,998 B2 | 5/2007 | Schwach et al. |
| 7,279,347 B2 | 10/2007 | Hon et al. |
| 7,332,365 B2 | 2/2008 | Nakamura et al. |
| 7,335,924 B2 | 2/2008 | Liu et al. |
| 7,345,315 B2 | 3/2008 | Hon et al. |
| 7,368,316 B2 | 5/2008 | Yokouchi et al. |
| 7,465,592 B2 | 12/2008 | Yoo |
| 7,582,910 B2 | 9/2009 | David et al. |
| 7,825,006 B2 | 11/2010 | Nakamura et al. |
| 7,915,624 B2 | 3/2011 | Jorgenson |
| 2006/0202211 A1 | 9/2006 | Ueda et al. |
| 2006/0273324 A1 | 12/2006 | Asai et al. |
| 2007/0045607 A1 | 3/2007 | Chen et al. |
| 2007/0096127 A1 | 5/2007 | Pattison et al. |

FOREIGN PATENT DOCUMENTS

| | | |
|---|---|---|
| JP | 2000261033 | 9/2000 |
| JP | 2000323753 | 11/2000 |
| JP | 2003163373 | 6/2003 |
| WO | WO 03098710 A1 | 11/2003 |

OTHER PUBLICATIONS

Shen, Y.C., et al., "Optical cavity effects in InGaN—GaN quantum-well-heterostructure flip-chip light-emitting diodes", "Applied Physics Letters", Apr. 7, 2003, pp. 2221-2223, vol. 82, No. 14.

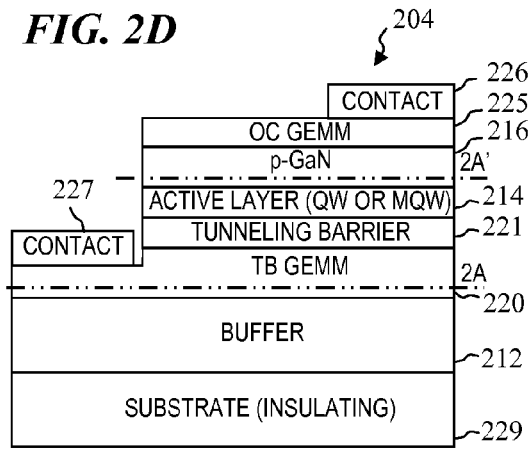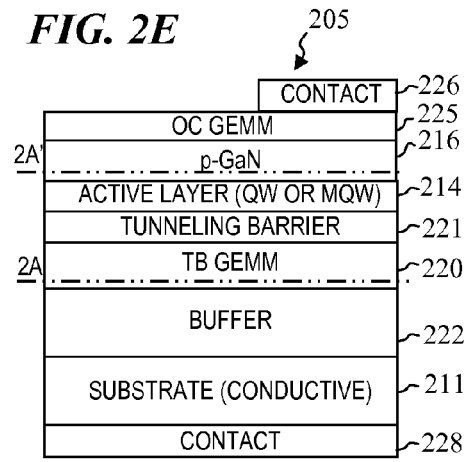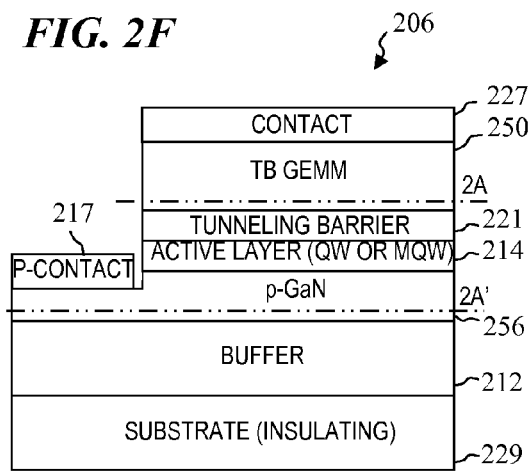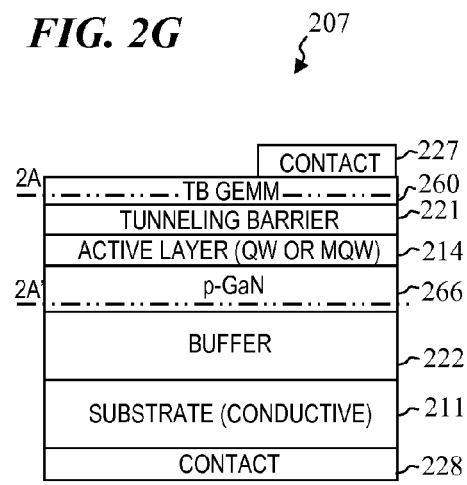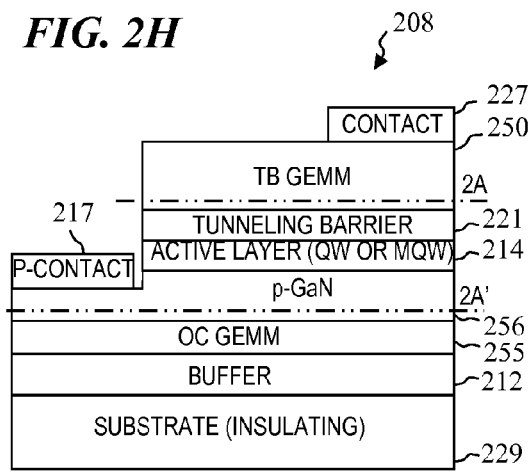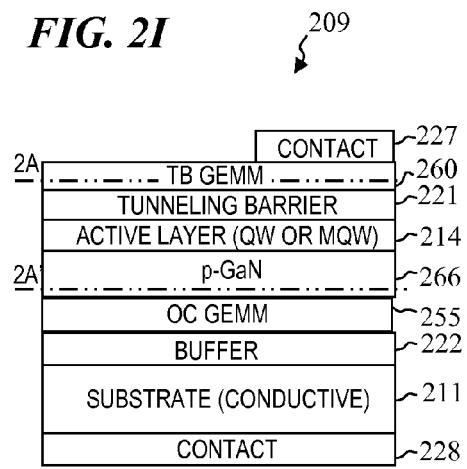

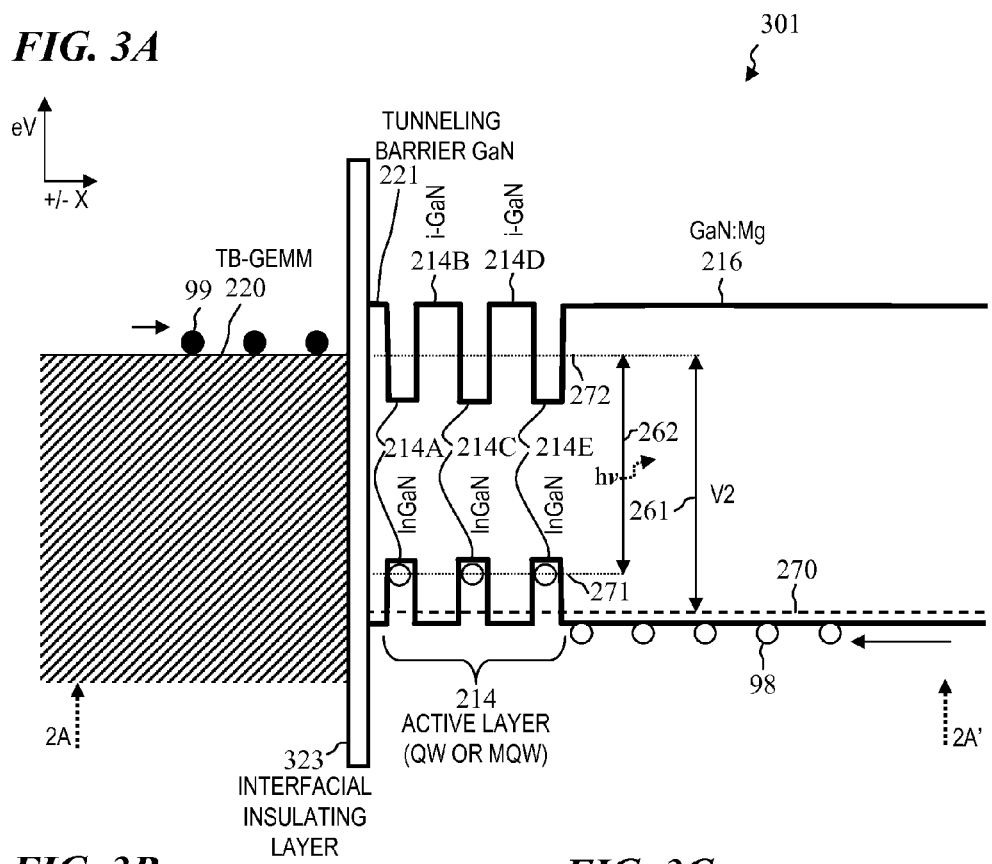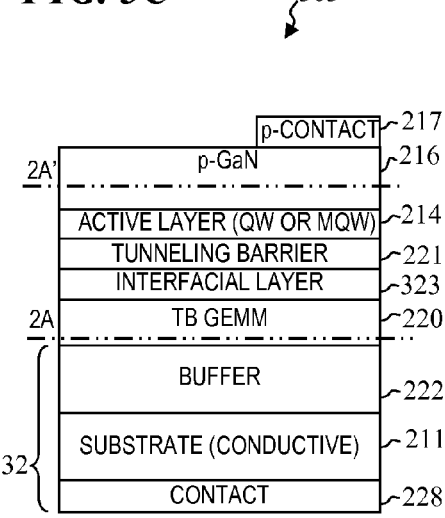

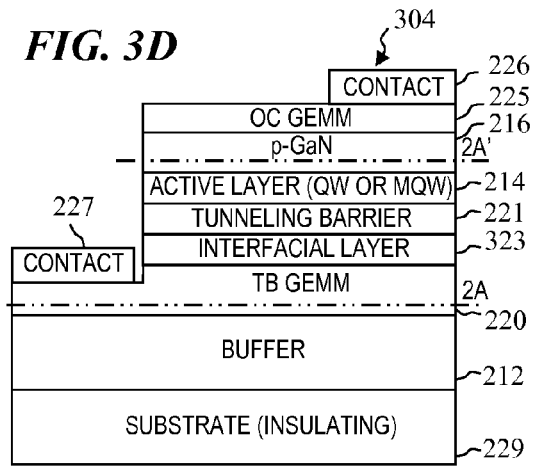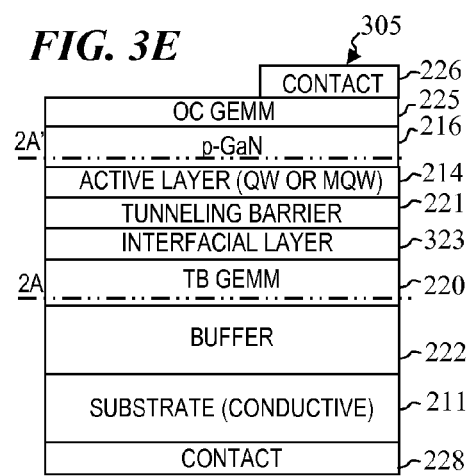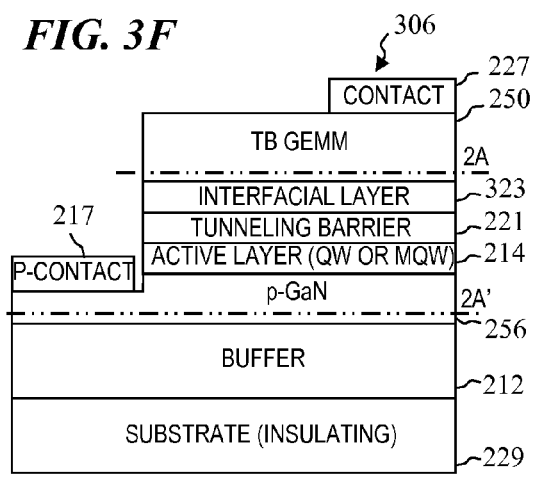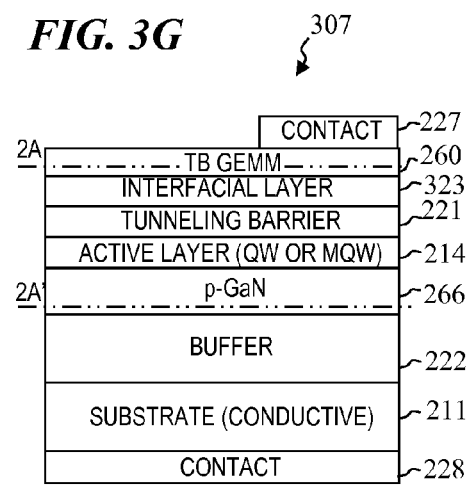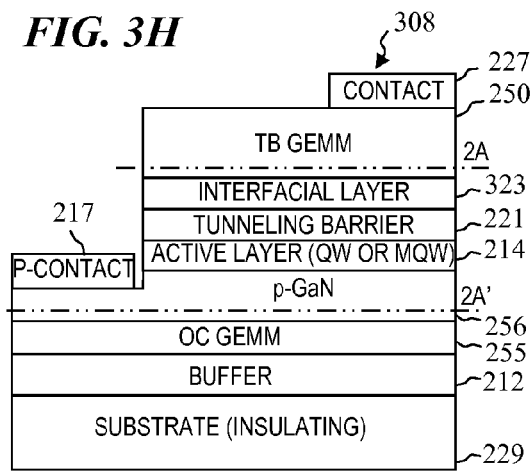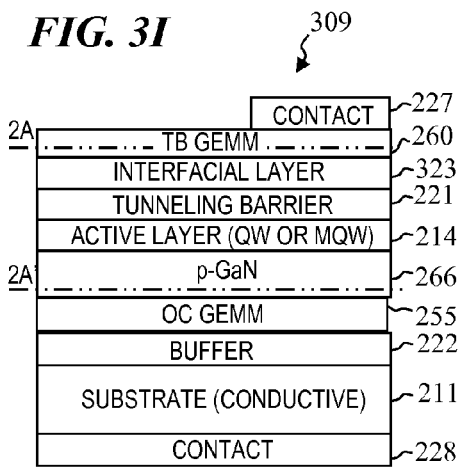

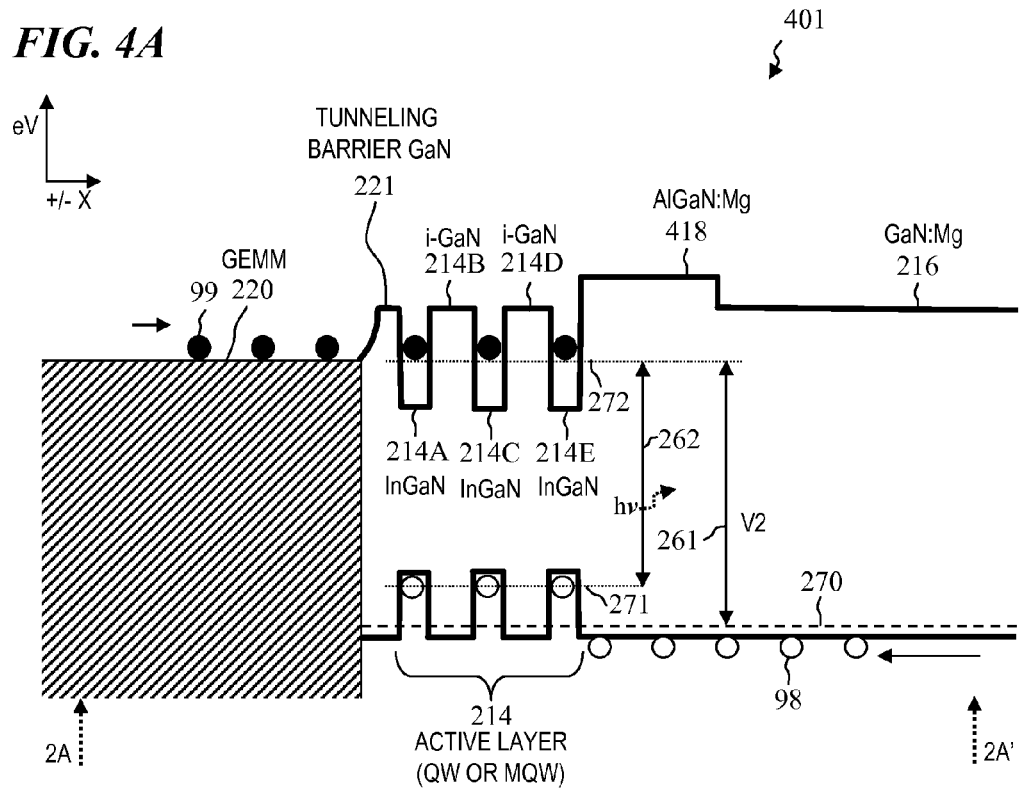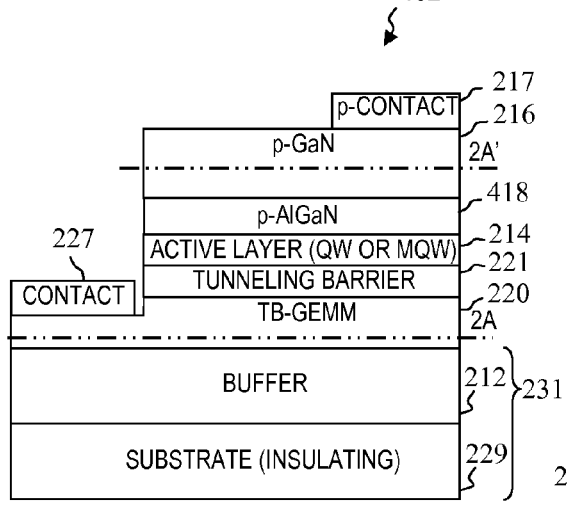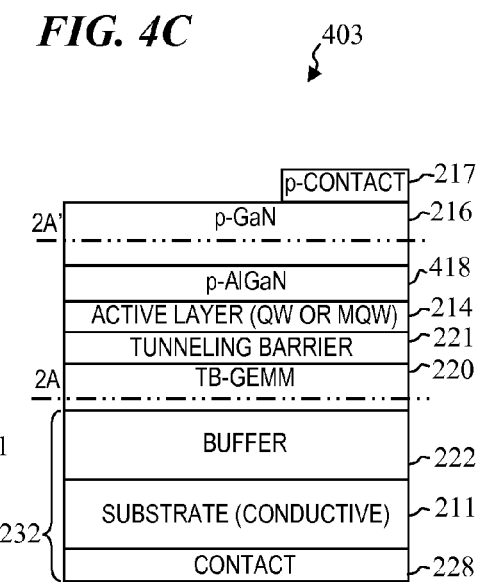

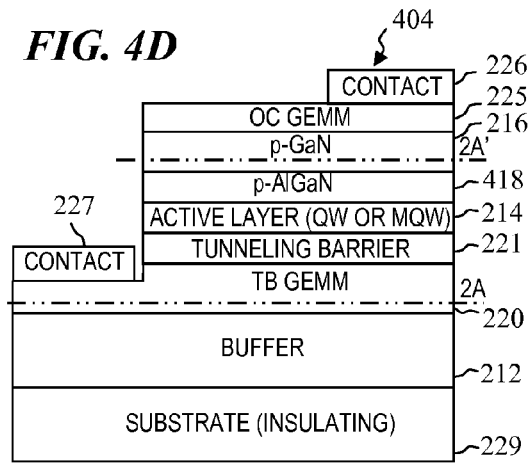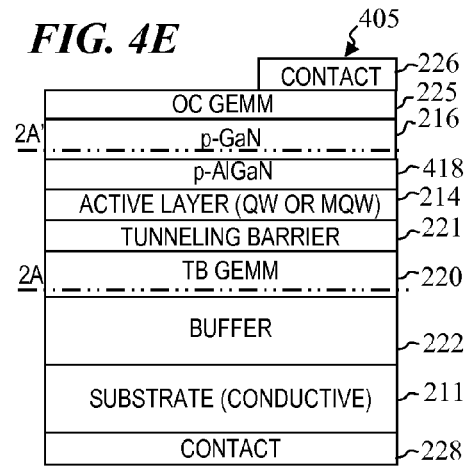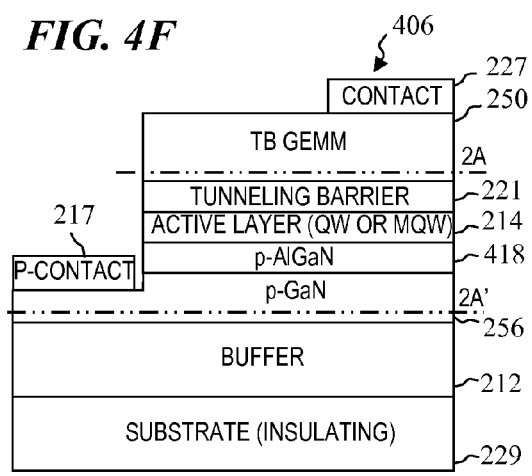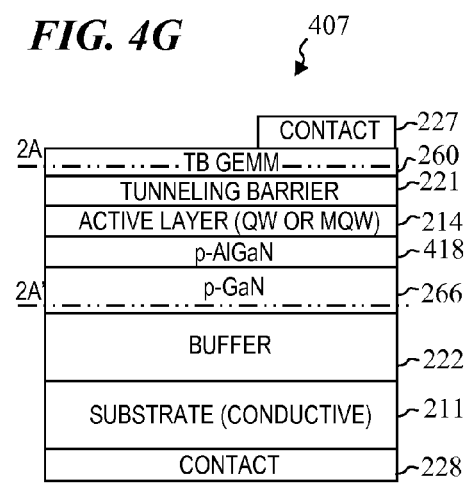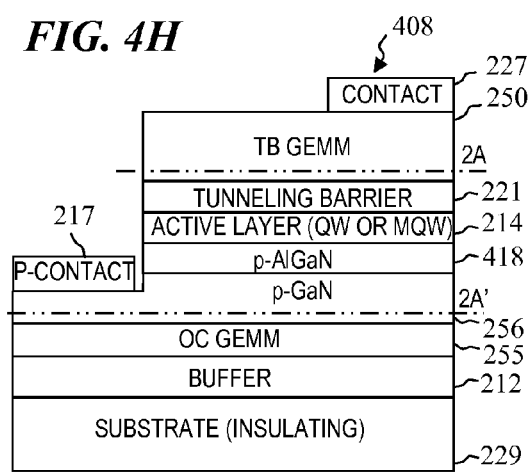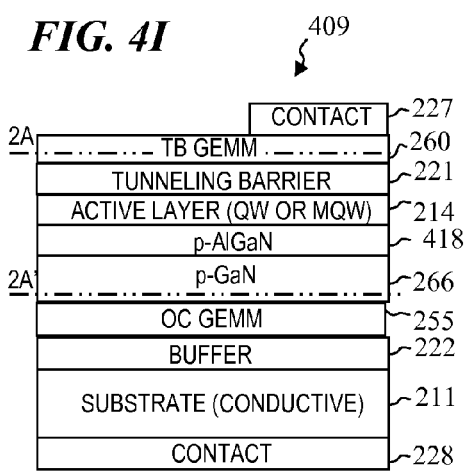

US 8,865,492 B2

METHOD OF FORMING CURRENT-INJECTING/TUNNELING LIGHT-EMITTING DEVICE

RELATED APPLICATIONS

This application is a divisional of U.S. patent application Ser. No. 12/393,029 filed Feb. 25, 2009, titled "CURRENT-INJECTING/TUNNELING LIGHT-EMITTING DEVICE AND METHOD" (which issued as U.S. Pat. No. 7,842,939 on Nov. 30, 2010), which claims benefit under 35 U.S.C. §119(e) of U.S. Provisional Patent Application No. 61/066,960, filed Feb. 25, 2008, which is incorporated herein by reference in its entirety.

The application is related to U.S. patent application Ser. No. 11/882,730, filed Aug. 3, 2007, titled III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS (which issued as U.S. Pat. No. 7,915,624 on Mar. 29, 2011), which is incorporated herein by reference in its entirety for all purposes.

FIELD OF THE INVENTION

The present invention relates to semiconductor light emitters and devices, and more particularly to an apparatus and method of manufacture of group III-nitride light-emitting diodes (LEDs), some embodiments of which provide a vertical-structure LED, and optionally include group III-nitride LEDs, GaN-based LEDs, and semiconductor laser diodes.

BACKGROUND OF THE INVENTION

This invention is related to III-Nitride based light-emitting diodes (LEDs). Over the past decade, group III-nitride based light-emitting devices have garnered significant attention due to the ability of group III-nitride based devices to output light having wavelengths in the ultra-violet (UV), blue and green light regimes. Despite the significant resources expended to develop and commercialize group III-nitride based light-emitting devices significant difficulties and barriers still exist to realizing group III-nitride based light-emitting devices with improved efficiency, reliability and performance characteristics. Conventional standard III-Nitride LEDs require that electrons are injected into the semiconducting device such that the electron potentials are at the conduction-band minimum of the n-type layer, for the purpose of later being injected into a lower-potential active region. The potential level of the initial electron injection determines the voltage that is required to drive the LED. Once the electrons are initially injected into the conventional standard LED device, the electrons drop in energy into an energy potential of the sub-band minimum of the active region from the n-type semiconductor conduction-band minimum and then combine with a positive carrier, thereby releasing energy as a photon. The initial drop in energy of the electron from the bottom of the n-type conduction band to the energy potential of the sub-band minimum of the active region is converted into heat and therefore wasted energy. This wasted energy is an issue because the generation of heat is not desirable due to decreased device reliability, and LEDs that are efficient in converting electrical energy to light are favored. Moreover, in conventional LEDs, the electrons may travel past the quantum wells into the p-type materials, where the electrons are recombine with holes outside of the active region of the device and therefore the energy expended to move the electrons into the conduction band of the n-GaN is wasted. One example of a conventional LED device that exhibits the prior mentioned limitation is shown in prior-art FIGS. 1A, 1B, and 1C.

U.S. Pat. No. 6,614,060 issued to Wang et al. on Sep. 2, 2003 titled "LIGHT EMITTING DIODES WITH ASYMMETRIC RESONANCE TUNNELING", and is incorporated herein by reference in its entirety for all purposes. Wang et al. describe an LED based on a two well system with charge asymmetric resonance tunneling that comprises first and second coupled wells, one being a wide well and the other an active quantum well. The wells are coupled via a resonance tunneling barrier which is substantially transparent for quantum-tunneling electrons and blocking for holes.

U.S. Pat. No. 6,426,512 to Ito et al. titled "GROUP III NITRIDE COMPOUND SEMICONDUCTOR DEVICE", and is incorporated herein by reference in its entirety for all purposes. Ito et al. describe an undercoat layer inclusive of a metal nitride layer that are formed on a substrate. Group III nitride compound semiconductor layers are formed on the undercoat layer continuously.

U.S. Pat. No. 7,176,483 to Grupp et al. titled "METHOD FOR DEPINNING THE FERMI LEVEL OF A SEMICONDUCTOR AT AN ELECTRICAL JUNCTION AND DEVICES INCORPORATING SUCH JUNCTIONS", and is incorporated herein by reference in its entirety for all purposes. Grupp et al. describe an electrical junction that includes a semiconductor (e.g., C, Ge, or a Si-based semiconductor), a conductor, and an interface layer disposed therebetween. The interface layer is sufficiently thick to depin a Fermi level of the semiconductor, yet sufficiently thin to provide the junction with a specific contact resistance of less than or equal to approximately 1000 $\Omega\text{-}\mu m^2$, and in some cases a minimum specific contact resistance.

There is a need for improved light-emitting diodes, particularly group III-nitride LEDs, and in particular, group III-nitride LEDs that use resonant tunneling barriers.

SUMMARY OF THE INVENTION

In some embodiments, the present invention provides an apparatus that includes a light-emitting device having a light-emitting active region, a tunneling-barrier (TB) structure facing adjacent the active region, a TB grown-epitaxial-metal-mirror (TB-GEMM) structure facing adjacent the TB structure, wherein the TB-GEMM structure includes at least one metal and is substantially lattice-matched to the active region, a conductivity-type III-nitride crystal structure adjacent facing the active region opposite the TB structure. Some embodiments further include a current-conducting contact electrically connected to the conductivity-type III-nitride structure. In some embodiments of the apparatus, the active region optionally includes a multiple-quantum-well (MQW) structure. In some embodiments of the apparatus, the MQW structure of the active region optionally includes quantum-well widths selected to provide a selected sub-band minimum energy potential, and the TB-GEMM structure includes an alloy composition such that metal current injectors have a Fermi energy potential that is substantially equal to the sub-band minimum energy potential of the MQW.

In some embodiments, the present invention provides a method for making a light-emitting device. This method includes forming a light-emitting active region, forming a tunneling-barrier (TB) structure such that in the light-emitting device the TB structure is facing adjacent the active region, forming a TB grown-epitaxial-metal-mirror (TB-GEMM) structure such that in the light-emitting device the TB-GEMM structure is facing adjacent the TB structure, wherein the TB-GEMM structure includes at least one metal and wherein the TB-GEMM structure is substantially lattice matched to the active region, forming a conductivity type III-nitride crystal structure such that in the light-emitting device the conductivity type III-nitride crystal structure is facing adjacent the active region opposite the TB structure. Some embodiments further include forming a current-conducting contact such that in the light-emitting device the current-conducting contact is electrically connected to the conductivity type III-nitride. In some embodiments of the method, the forming of the active region optionally includes forming a multiple-quantum-well (MQW) structure. In some embodiments of the method, the forming of the MQW structure of the active region optionally includes forming quantum-well widths selected to provide a selected sub-band minimum energy potential, and the TB-GEMM structure includes an alloy composition such that metal current injectors have a Fermi energy potential that is substantially equal to the sub-band minimum energy potential of the MQW.

BRIEF DESCRIPTION OF THE DRAWINGS

FIG. 2D is a block diagram of an MQW device 204 having an insulative substrate and an optical cavity, according to some embodiments of the present invention.

FIG. 2E is a block diagram of an MQW device 205 having a conductive substrate and an optical cavity, according to some embodiments of the present invention.

FIG. 2F is a block diagram of an MQW device 206 having an insulative substrate wherein light can be emitted through the substrate, according to some embodiments of the present invention.

FIG. 2G is a block diagram of an MQW device 207 having a conductive substrate and a thin top-side GEMM structure that allows light to be emitted through it and out the top of the device, according to some embodiments of the present invention.

FIG. 2H is a block diagram of an MQW device 208 having an insulative substrate, a thin bottom-side GEMM to form an optical cavity wherein light can be emitted through the bottom-side GEMM and the substrate, according to some embodiments of the present invention.

FIG. 2I is a block diagram of an MQW device 209 having a conductive substrate and a thin top-side GEMM structure that forms an optical cavity and allows light to be emitted through it and out the top of the device, according to some embodiments of the present invention.

FIG. 3A is an energy-level diagram 301 of an MQW device 302 or 303, according to some embodiments of the present invention.

FIG. 3B is a block diagram of an MQW device 302 having an insulative substrate, according to some embodiments of the present invention.

FIG. 3C is a block diagram of an MQW device 303 having a conductive substrate, according to some embodiments of the present invention.

FIG. 3D is a block diagram of an MQW device 304 having an insulative substrate and an optical cavity, according to some embodiments of the present invention.

FIG. 3E is a block diagram of an MQW device 305 having a conductive substrate and an optical cavity, according to some embodiments of the present invention.

FIG. 3F is a block diagram of an MQW device 306 having an insulative substrate wherein light can be emitted through the substrate, according to some embodiments of the present invention.

FIG. 3G is a block diagram of an MQW device 307 having a conductive substrate and a thin top-side GEMM structure that allows light to be emitted through it and out the top of the device, according to some embodiments of the present invention.

FIG. 3H is a block diagram of an MQW device 308 having an insulative substrate, a thin bottom-side GEMM to form an optical cavity wherein light can be emitted through the bottom-side GEMM and the substrate, according to some embodiments of the present invention.

FIG. 3I is a block diagram of an MQW device 309 having a conductive substrate and a thin top-side GEMM structure that forms an optical cavity and allows light to be emitted through it and out the top of the device, according to some embodiments of the present invention.

FIG. 4A is an energy-level diagram 401 of an MQW device 402 or 403, according to some embodiments of the present invention.

FIG. 4B is a block diagram of an MQW device 402 having an insulative substrate, according to some embodiments of the present invention.

FIG. 4C is a block diagram of an MQW device 403 having a conductive substrate, according to some embodiments of the present invention.

FIG. 4D is a block diagram of an MQW device 404 having an insulative substrate and an optical cavity, according to some embodiments of the present invention.

FIG. 4E is a block diagram of an MQW device 405 having a conductive substrate and an optical cavity, according to some embodiments of the present invention.

FIG. 4F is a block diagram of an MQW device 406 having an insulative substrate wherein light can be emitted through the substrate, according to some embodiments of the present invention.

FIG. 4G is a block diagram of an MQW device 407 having a conductive substrate and a thin top-side GEMM structure that allows light to be emitted through it and out the top of the device, according to some embodiments of the present invention.

FIG. 4H is a block diagram of an MQW device 408 having an insulative substrate, a thin bottom-side GEMM to form an optical cavity wherein light can be emitted through the bottom-side GEMM and the substrate, according to some embodiments of the present invention.

FIG. 4I is a block diagram of an MQW device 409 having a conductive substrate and a thin top-side GEMM structure that forms an optical cavity and allows light to be emitted through it and out the top of the device, according to some embodiments of the present invention.

DESCRIPTION OF EMBODIMENTS

Figure 1A:
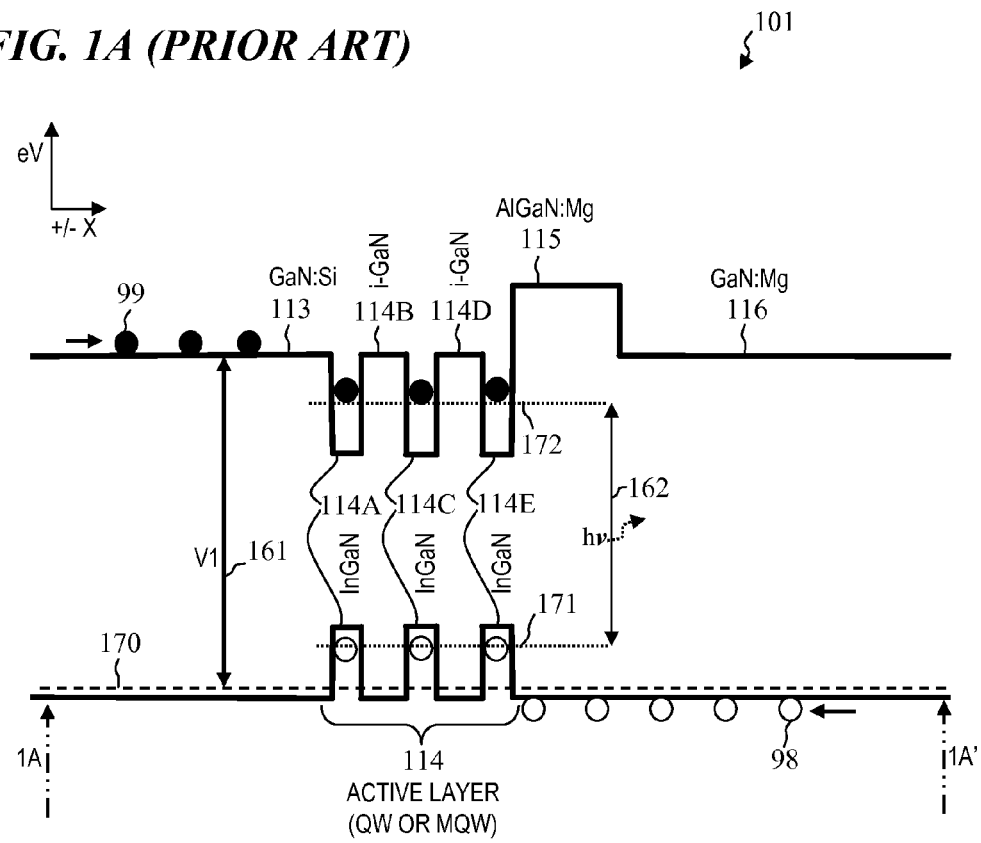
FIG. 1A is an energy-level diagram 101 of a prior-art multiple-quantum-well (MQW) device 102 or 103.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Device structures including various configurations of an epitaxially grown metal mirror are described. As used herein, these embedded mirrors (or mirror configurations) are referred to as a Grown-Epitaxial-Metal-Mirror (GEMM) or a GEMM layer. In some embodiments, the GEMM layer is configured (e.g., by adjusting its work function) to facilitate tunneling of holes or electrons into a multiple-quantum-well (MQW).

As used herein:

Two structures are "facing adjacent" one another when one structure has a major face at least a portion of which is facing a portion of a major face of the other structure and adjacent such that the portions of the major faces are near to or touch each other.

Two structures are "edge adjacent" one another when one structure has an edge at least a portion of which is near to or touching a portion of an edge of the other structure.

Two structures are "adjacent" one another when one structure is either facing adjacent or edge adjacent the other structure.

Two structures are "facing touching" one another when one structure has a major face at least a portion of which is facing a portion of a major face of the other structure and adjacent such that the portions of the major faces are touch each other.

Two structures are "edge touching" one another when one structure has an edge at least a portion of which is touching a portion of an edge of the other structure.

Two structures are "touching" one another when one structure is either facing adjacent or edge adjacent the other structure.

As used herein, the term "double heterojunction" refers to a semiconductor material structure wherein a semiconductor layer having a smaller bandgap is sandwiched between two semiconductor layers having a larger bandgap.

As used herein, the term "quantum well" ("QW") refers to a semiconductor material structure wherein a semiconductor layer having a smaller bandgap is sandwiched between two semiconductor layers having a larger bandgap and the thickness of the smaller bandgap semiconductor layer is thin such that conduction-band splitting and valence-band splitting occurs in the smaller bandgap semiconductor layer.

As used herein, the term "multiple quantum well" ("MQW") refers to a structure having multiple quantum wells positioned such that the QW's are adjacent to one another. In some embodiments, the present invention includes MQWs having between about two quantum wells and about four quantum wells inclusive, between four quantum wells and eight quantum wells inclusive, between eight quantum wells and 12 quantum wells inclusive, or more than 12 quantum wells. In some embodiments, when the quantum wells are thin enough such that the wave functions of the quantum wells overlap the multiple quantum well structure is referred to a "super-lattice quantum-well structure".

As used herein, the term "tunneling barrier" refers to a thin layer of material (e.g., semiconducting, insulating, conducting or the like) that is thin enough to allow charge carriers (i.e., electrons and holes) to quantum-mechanically tunnel through, but is a substantial barrier to regular current flow. In some embodiments, the tunneling barrier has a thickness in the range of about 1 angstrom and 150 angstroms, in some other embodiments the tunneling barrier has a thickness in the range of about 1 angstrom and 10 angstroms, between 10 angstroms and 15 angstroms, between 15 angstroms and 20 angstroms, between 20 angstroms and 30 angstroms, between 30 angstroms and 40 angstroms, between 40 angstroms and 50 angstroms, between 50 angstroms and 75 angstroms, between 75 angstroms and 100 angstroms, between 100 angstroms and 125 angstroms, or between 125 angstroms and 150 angstroms; each of the ranges being inclusive of their endpoints. In some embodiments, the tunneling barrier thickness and the thickness of the quantum well(s) contributes to the energy-band splitting and therefore can be used to tune the Fermi level energy of the combined tunneling barrier/active region structure.

As used herein, the term "resonance tunneling barrier" (RTB) refers to a tunneling barrier wherein the energy level of the material on one side of the tunneling barrier is the same as or approximately the same as the energy level of the material on the opposite side of the tunneling barrier. In some embodiments, depending on the work function of the metal on one side of the RTB, the RTB can be configured to preferentially tunnel either holes or electrons, but not the other. In such a case there is an increased probability that the selected charge carrier will tunnel through the RTB due to a resonance between the two energy levels on either side of the RTB.

In some embodiments, the present invention provides semiconductor-based devices for emitting light, and more specifically group III-nitride semiconductor-based devices for emitting light, including GaN, InN, AlN, InGaN, AlGaN, AlGaInN, and the like. In some embodiments, the present invention provides light-emitting devices that use semiconductors other than from the group III-nitrides, for example, group IV semiconductors, group III-V semiconductors, group II-VI semiconductors, Si, Ge, GaP, InP, InGaP, AlGaP, GaAs, GaAsP, GaSb, GaSbAs, GaAlP, InGaAlP, InGaAsP, AlGaAs, AlGaInAs, AlN, ZnSe, and SiC, and the like. In some embodiments, light-emitting devices of the present invention use various stoichiometric compounds of the prior identified semiconductors as well as multiple layers of the prior identified semiconductors, and the like. In some embodiments, semiconductor layers as used in the present invention (including the quantum wells, quantum well barriers, blocking layers, and the like) include semiconductor materials from the above-described list.

In some embodiments, light-emitting devices of the present invention are formed using a substrate or growth template and growing or forming subsequent device active layers on the substrate or growth template. In some embodiments, the type of substrate or growth template used in the present invention is chosen to achieve a particular device structure (e.g., vertical, flip-chip, or top-side contacts, top-side light output, substrate light output, or the like), achieve a particular light-output wavelength, to reduce cost for high-volume manufacturing, or to optimize performance. In some embodiments, the substrate or growth template includes silicon, sapphire, silicon carbide, zinc oxide, spinel, GaAs, GaN, InP, $MgAl_2O_4$, AlN, GaP, MgO, $LiGaO_2$, $LiAlO_2$, $NdGaO_3$, $ScAlMgO_4$, $Ca_8La_2(PO_4)_6O_2$, Zr, Hf, ScN, TiN, NbN, $Zr_xHf_{(1-x)}B_2$ or $Zr_xHf_{(1-x)}N$ where x is between 0 and 1, inclusive, and the like. In some embodiments, the substrate is optionally removed by various techniques including laser liftoff, wet etching, dry etching, or the like.

In some embodiments, a buffer layer or buffer structure is formed directly on the substrate prior to growing active device layers to provide material having device quality material characteristics (e.g., surface roughness, dislocation density, lattice constant, and the like) upon which to grow subsequent active device layers. In some embodiments, buffer layers used in the present invention include doped and undoped semiconductor layers, conductive layers, insulating layers or any combinations of semiconductor, conducting and insulating layers or the like. In some embodiments, the buffer layer may include p-doped GaN, n-doped GaN, intrinsically doped GaN (unintentionally doped GaN), SiGe, AlN, ZrN, Al, $SiO_2$, $Si_3N_4$, GaO, combinations and multiple layers, or the like. In some embodiments, the buffer layer includes an intrinsically doped GaN layer grown having a thickness of about 2 microns grown on the substrate and in some other embodiments the buffer layer includes a silicon-doped GaN (i.e., n-doped GaN) layer grown on the substrate and having a thickness of about 2 microns.

In some embodiments, the light-emitting device includes a grown epitaxial metal mirror (GEMM) that can be formed directly on the substrate or growth template, on the buffer layer, or on other layers of the device structure that have device-quality characteristics. In some embodiments, the GEMM may be grown fully non-transparent and highly reflective as per its bulk-material properties or may be grown semi-transparent to fit the requirements of different device structures by simply adjusting the GEMM growth time, and thus thickness during epitaxy. In some embodiments, the materials used for the GEMM closely match the lattice constant of the III-nitride layers and have device-quality characteristics. In some embodiments, GEMM layers have a number of advantages over conventional light-emitting device structure components such as Distributed Bragg Reflectors (DBRs) or non-epitaxial mirrors. For example, GEMM layers may not require the layering of numerous alternating semiconductor materials, like DBRs, that may create defects and cracks. Additionally, the GEMM layer may be used as a conductive layer to increase electrical current injection and current distribution. Furthermore, the superior current distribution may improve electrostatic-discharge reliability. In some embodiments, the thickness of the GEMM layer is between about 1 nm and about 150 nm, such that the GEMM layer is partially transmissive. In some embodiments, the thickness of the GEMM layer is between about 150 nm and about 1 micron, such that the GEMM layer is highly reflective.

In some embodiments, the GEMM layer may include refractory metals and/or metallic compounds, such as the Group IVB metals Zr, Hf, ($Hf_xZr_{1-x}$, where x is between 0 and 1, inclusive), and the transitional metal diborides $ZrB_2$, $HfB_2$, $YB_2$ and ($Hf_xZr_yY_zB_2$ where x+y+z=1, and x and y and z are each between 0 and 1, inclusive) and the transitional metal nitrides ZrN, HfN, TiN, YZrN and ($Hf_xZr_yY_zN$ where x+y+z=1, and x and y and z are each between 0 and 1, inclusive).

In some embodiments, the material for the GEMM comprises various metals and metal compounds which may be grown closely lattice matched to the substrate or growth template, or the buffer layer, or other layers located in the light-emitting device and having sufficient device quality, thereby avoiding the difficulties and reduced device performance caused by high dislocation densities. In some embodiments, the GEMM materials are thermal-expansion matched to the substrate or growth template, or the buffer layer, or other layers located in the light-emitting device and having sufficient device quality, thereby reducing the likelihood of cracking and dislocation densities. In some embodiments, the GEMM material layers are grown using Metal-Organic Chemical Vapor Deposition (MOCVD), Pulsed Laser Deposition (PLD), smart-shuttering metal-modulated closed-loop molecular-beam epitaxy, Organo-Metallic Vapor Phase Epitaxy (OMVPE), Molecular Beam Epitaxy (MBE), Hydride Vapor Phase Epitaxy (HVPE), Physical Vapor Deposition (PVD) and/or the like.

In some embodiments, device-quality GEMM may be used in place of the n-type III-nitride layer bounding the active region of a conventional III-nitride semiconductor light-emitter epitaxial stack. In some embodiment, the GEMM may reduce problematic static-discharge damage.

In some embodiments, the bulk conductivity of the GEMM materials are between about 5 times and about 30 times more conductive than the moderately doped n-type III-nitride layers currently incorporated into group III-nitride based light-emitting structures. The highly-conductive properties of the GEMM may serve to improve the electronic-carrier transport across the device, thereby creating pathways for current to flow, and therefore reduce the impact of unwanted static discharge.

In some embodiments, the light-emitting device of the present invention includes an active region formed in the device structure for the purpose of generating light, and the active region includes one or more semiconducting materials in which electrically excited electrons combine with holes to generate photons having a specific wavelength. In some embodiments, the active region of the light-emitting device can include a double heterojunction, or a quantum-well (QW) structure or a multiple-quantum-well (MQW) structure. In some embodiments, the double heterojunction active region structure includes a layer of InGaN having a thickness of between about 200 angstroms and about 5 microns, sandwiched between a resonance tunneling barrier (RTB) having a thickness of between about 2 angstroms and about 25 angstroms and a p-type GaN (e.g., Mg-doped GaN) layer having a thickness of between about 200 nm and about 5 microns. In some embodiments, the QW active region structure includes a layer of InGaN having a thickness of between about 5 angstroms and about 200 angstroms, sandwiched between a resonance tunneling barrier (RTB) having a thickness of between about 2 angstroms and about 100 angstroms and a p-type GaN (e.g., Mg-doped GaN) layer having a thickness of between about 200 nm and about 5 microns. In some embodiments, the MQW active region structure has three QW's and includes multiple layers of InGaN, each having a thickness of between about 5 angstroms and about 200 angstroms, the first InGaN layer sandwiched between a resonance tunneling barrier (RTB) having a thickness of between about 2 angstroms and about 50 angstroms and an i-GaN layer having a thickness of between about 25 angstroms and about 150 angstroms, the second (i.e., the middle) InGaN layer sandwiched between two i-GaN layers each having a thickness of between about 25 angstroms and about 150 angstroms, and the third InGaN layer sandwiched between an i-GaN layer having a thickness of between about 25 angstroms and about 150 angstroms and p-type GaN (e.g., Mg-doped GaN) layer having a thickness of between about 200 nm and about 5 microns.

In some embodiments, the present invention provides a second mirror that is located on a side of the active region that is opposite the GEMM layer. In some embodiments, the second mirror is used to reflect light emitted by the active region to enhance light output from the device and/or to form an optical cavity having an optical cavity length defined by the distance between the GEMM layer and the second mirror. In some embodiments, the second mirror includes at least one of the following: a highly reflective mirror, a partially reflecting and partially transmissive mirror, a GEMM, a Distributed Bragg Reflector (DBR), a transparent conducting mirror (e.g., Indium Tin Oxide (ITO)), an interfacial mirror, a metal mirror, an interface between a semiconductor and air, or the like. In some embodiments, the second mirror is any other suitable mirror structure.

As used herein, the term "tunneling barrier GEMM" ("TB-GEMM") (also called "active region GEMM" ("AR-GEMM")) refers to a GEMM layer that is positioned next to a tunneling barrier or RTB and is used to provide charge carriers that tunnel through the tunneling barrier or the RTB. As used herein, the term "optical-cavity GEMM" ("OC-GEMM") refers to a GEMM layer that is used as a second mirror and is not used to provide charge carriers that tunnel through a tunneling barrier or RTB. In some embodiments, the first GEMM is an AR-GEMM and the second mirror is an OC-GEMM configured to form an optical cavity where an active region is located between the AR-GEMM and the OC-GEMM.

In some embodiments, the present invention provides an interfacial insulating layer that is positioned between an AR-GEMM and a semiconductor tunneling barrier or between an AR-GEMM and a semiconductor RTB in order to depin the Fermi level of the semiconductor tunneling barrier or semiconductor RTB such that dangling bonds at the interface of the AR-GEMM and the semiconductor tunneling barrier are terminated and the impact of metal-induced gap states (MIGS) on the semiconductor Fermi level is reduced. When the Fermi level of the semiconductor tunneling barrier has been depinned, the work function of the AR-GEMM can then be tuned such that the Fermi level of the AR-GEMM can line up with the first sub-band in the conduction band in the active region of the QW or MQW structure to enhance resonance tunneling, or the Fermi level of the AR-GEMM can line up with the conduction band of the of the small bandgap semiconductor in the double heterojunction active region to enhance resonance tunneling. In some embodiments, the tunneling barrier layer also provides the function of the interfacial insulating layer, that is, the tunneling barrier layer is used to both "depin" the Fermi level of the active region and to provide the tunneling barrier which selected charge carriers tunnel through to the quantum well sub-band potential. In some embodiments, the interfacial layer includes a passivating material, for example, a nitride, a fluoride, an oxide, an oxynitride, a hydride and/or an arsenide of the semiconductor; and in some cases may also include a separation layer. In other embodiments, other insulating materials are used for passivation. In some embodiments, the passivating material may consist essentially of a monolayer thereof, or in some cases may have a thickness that allows a Fermi level of the GEMM to align with a conduction band of the semiconductor, a valence band of the semiconductor, sub-bands of the active regions, or be independent of a Fermi level of the semiconductor. In some embodiments, the interfacial layer or the tunneling barrier, when also acting as an interfacial layer, is used to reduce or substantially eliminate non-radiative-recombination sites at the interface between a GEMM layer and a semiconductor layer (including tunneling barriers, quantum well layers, quantum well blocking layers, and the like).

In some embodiments, the present invention provides a light-emitting device that includes a double TB-GEMM/tunneling barrier structure. That is, in some embodiments, the active region of the LED includes a TB-GEMM/tunneling barrier structure on each face of the active region such that the first TB-GEMM/tunneling barrier structure on the first face of the active region is configured to allow electrons to tunnel from the first TB-GEMM through the first tunneling barrier and into the electron potential level of the active region and the second TB-GEMM/tunneling barrier structure on the opposing second face of the active region is configured to allow holes to tunnel from the second TB-GEMM through the second tunneling barrier and into the hole potential level of the active region. In some embodiments, one or both of these TB-GEMM structures are made thin enough to emit the light generated by the combinations of holes and electrons in the active region. In some embodiments, the first TB-GEMM/tunneling barrier structure is configured to allow electrons to tunnel through the first tunneling barrier to the active region while providing a barrier preventing holes from tunneling from the active region to the first TB-GEMM. In some embodiments, the second TB-GEMM/tunneling barrier structure is configured to allow holes to tunnel through the second tunneling barrier to the active region while providing a barrier preventing electrons from tunneling from the active region to the second TB-GEMM. Thus, these layers are called "tunneling-barrier layers."

In some embodiments, the present invention provides light-extraction structures that improve or enhance the light output or extraction efficiency of the light-emitting device, including roughened light surfaces, photonic crystals and the like. Any combination of light-extraction structures may be coupled with the GEMM, including multiple variations that may be employed such as combining multiple light-extraction structures on one or both sides of the active region.

In some embodiments, the present invention provides device structures utilizing optical-cavity effects for enhanced light extraction that includes an active region having an optimized thickness and placement with respect to light-extraction features and with respect to various configurations. In some embodiments, the device structures with enhanced light extraction include resonant-cavity light-emitting devices (RCLED) or micro-cavity light-emitting devices (MCLED). In some embodiments, a standing wave is generated by the interference between light emitted by the active region and light reflected by the GEMM, and/or by the interference between light emitted by the active region and light reflected by a second mirror located opposite the GEMM, and/or by the interference between light reflected by the GEMM and light reflected by second mirror located opposite the GEMM. In some embodiments, the active region of the light-emitting device is positioned at an antinode of a standing wave generated in the manner previously identified such that the extraction efficiency of the light emitting device is improved. This enables light to be directed into modes (or a single mode) to increase the amount of light propagating out of the LED. Light generated by optical-cavity devices is more directional and spectrally pure compared to standard LEDs.

In some embodiments, light propagates through the top of the device structure, away from the substrate side. In other embodiments, light propagates through a transparent substrate at the bottom of the device structure in the form of a "Flip Chip". In some embodiments, the light exits in a plurality of directions.

As used herein, the term "growth template" refers to a crystalline interface or substrate onto which epitaxial material is grown.

As used herein, the term "resonant cavity" refers to a resonant optical cavity used to enhance light output in a solid-state light-emitting device. For example, in some embodiments, a resonant cavity is formed between an MQW active region and a reflector spaced a small distance away such that the light reflecting between the MQW active region and the reflector form an optical mode that is preferred over other energy-depleting mechanisms. In some embodiments, the resonant cavity is formed between the first mirror spaced a distance from one side of the MQW and the MQW, between the second mirror spaced a distance from the other side of the MQW and the MQW, or between the first mirror and the second mirror.

As used herein, the term "microcavity" refers to a very small resonant optical cavity used to enhance light output in a solid-state light-emitting device. For example, in some embodiments, a microcavity is formed between an MQW active region and a reflector spaced a small distance away such that the light reflecting between the MQW active region and the reflector form an optical mode that is preferred over other energy-depleting mechanisms. In some embodiments, the microcavity is formed between the first mirror spaced a distance from one side of the MQW and the MQW, between the second mirror spaced a distance from the other side of the MQW and the MQW, or between the first mirror and the second mirror.

In some embodiments, the light-emitting device structure of the present invention, wherein an optical cavity is formed between the TB-GEMM layer and a second mirror, is used to form a semiconductor laser configured to output laser light.

As used herein, the term "photonic-crystal-assisted light emitter" refers to a one-dimensional (1D), a two-dimensional (2D), or a three-dimensional (3D) solid-state structure formed according to well-known photonic crystal principles (see, e.g., PHOTONIC CRYSTALS: MOLDING THE FLOW OF LIGHT (SECOND EDITION) by John D. Joannopoulos et al., Princeton University Press; $2^{nd}$ edition (Feb. 11, 2008), ISBN number 13:978-0691124568).

Some embodiments of the invention include an improved LED that employs materials and device designs described in, but not limited to, U.S. patent application Ser. No. 11/882,730 titled III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS (which issued as U.S. Pat. No. 7,915,624 on Mar. 29, 2011), which is incorporated herein by reference in its entirety for all purposes. One material and structure used in some embodiments of the device, referred to as an Epitaxially Grown Metal Mirror (called GEMM herein) is used as an electrode. In some embodiments, the GEMM is also used as a growth template for subsequent layers and a reflective mirror to be used as a microcavity light emitter or a resonant-cavity light emitter or a photonic-crystal-assisted light emitter or the like or any combination of these structures. In some embodiments, this GEMM layer is used to inject charge carriers through a barrier or barriers into the active region at a reduced electron potential compared to injection electron potentials of conventional LEDs to reduce the voltage required to drive a light-emitting diode and assist in the efficient process of combination of electrons and holes in the device active region.

Figure 1B:
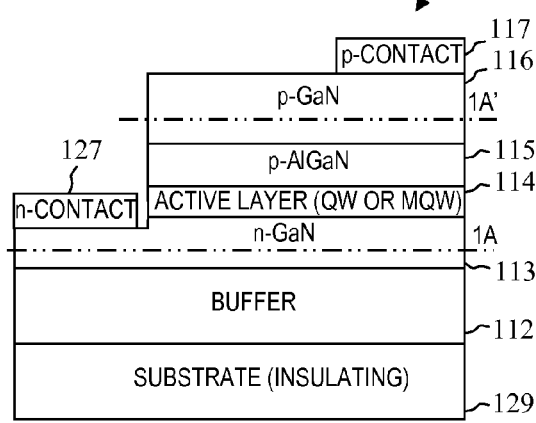
FIG. 1B is a block diagram of a prior-art MQW device 102 having an insulative substrate.

FIG. 1A is an energy-level diagram 101 of a prior-art multiple-quantum-well (MQW) device 102 or 103. In this diagram, the following reference numbers refer to:
   98=positive charge carrier "hole"
   99=electron
   112=a buffer layer used to facilitate lattice matching to insulative substrate
   113=n-GaN
   114=the active region as a whole, which includes 114A-114E
   114A, 114C, 114E=first, and optionally second and additional quantum wells
   114B, 114D=first, and optionally additional quantum well barriers
   115=current blocking layer
   116=p-type GaN
   117=a top-side electrical contact contacting the p-type GaN
   122=a buffer layer used to facilitate lattice matching to conductive substrate
   127=a top-side electrical contact for contacting the TB-GEMM
   128=a bottom-side electrical contact
   129=an insulating substrate used in some embodiments FIG. 1B is a block diagram of a prior-art MQW device 102 having an insulative substrate 129. Device 102 is formed by depositing a buffer layer 112 on substrate 129. A layer of n-GaN 113 is grown on substrate buffer 112 such that the lattice structure of n-GaN 113 matches the lattice structure of substrate buffer 112, in order that n-GaN 113 forms a well-ordered crystal template upon which a high-quality active layer 114 can be grown. A p-AlGaN layer 115 is grown on active layer 114, a p-type GaN layer 116 is grown on p-AlGaN layer 115, and a p-contact structure 117 is formed on p-type GaN layer 116 to provide a compatible electrical contact for light-emitting MQW device 102.

Figure 2A:
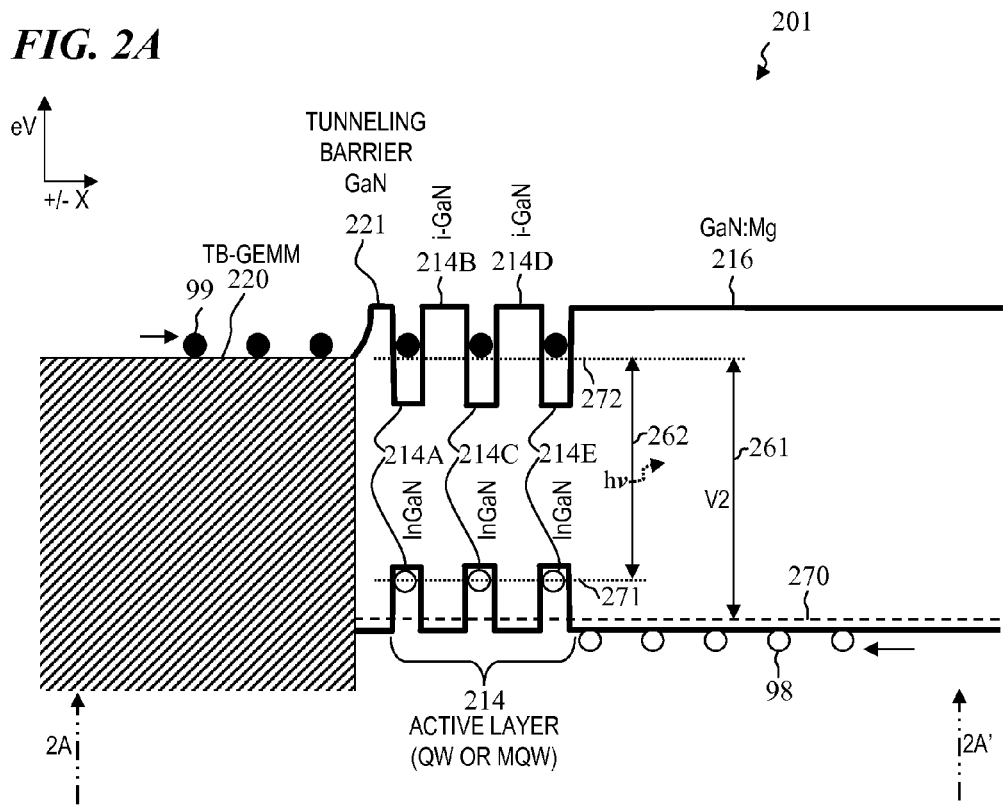
FIG. 2A is an energy-level diagram 201 of an MQW device 202 or 203, according to some embodiments of the present invention.
Figure 2B:
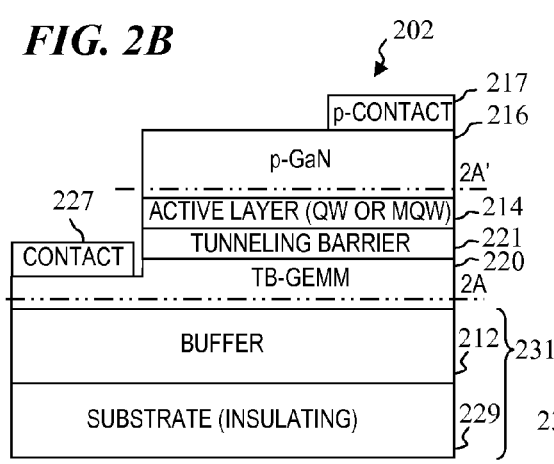
FIG. 2B is a block diagram of an MQW device 202 having an insulative substrate, according to some embodiments of the present invention.
Figure 2C:
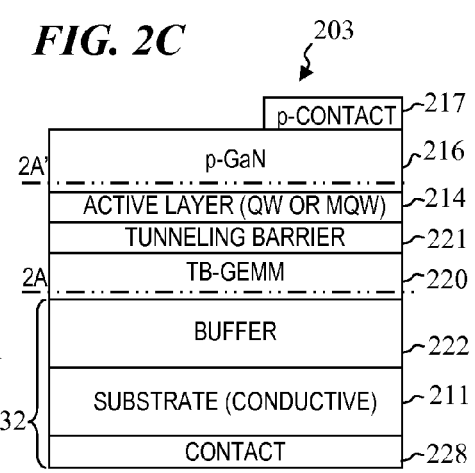
FIG. 2C is a block diagram of an MQW device 203 having a conductive substrate, according to some embodiments of the present invention.

FIG. 2C is a block diagram of an MQW device 103 having a conductive substrate, according to some embodiments of the present invention. Device 103 is substantially the same as device 102 of FIG. 1A, except that conductive substrate 128 of device 103 replaces substrate 129 of device 102.

FIG. 2A is an energy-level diagram 201 of an MQW device 202 (such as shown in FIG. 2B), or 203 (such as shown in FIG. 2C), or 204 (such as shown in FIG. 2D), or 205 (such as shown in FIG. 2E), or 206 (such as shown in FIG. 2F), or 207 (such as shown in FIG. 2G), or 208 (such as shown in FIG. 2H), or 209 (such as shown in FIG. 2I), according to some embodiments of the present invention. In FIGS. 2A-2I (as well as in the rest of the figures in the application), the following reference numbers refer to:

- 98=a "hole"—a positive-charge carrier
- 99=Electron—a negative-charge carrier
- 211=a conducting substrate used in some embodiments
- 212=a buffer layer used to facilitate lattice matching to insulative substrate
- 214=active region, wherein the SQW, MQW, or heterojunctions are located
- 214A, 214C, 214E=first, and optionally second and additional quantum wells between tunneling layers or double hetero junction layer(s)
- 214B, 214D=first, and optionally additional quantum well barriers form additional tunneling layer/1-GaN layers optionally forming one or more additional quantum wells 214C, 214E and the like
- 216=top-side p-type GaN (in other embodiments, this could be n-type GaN)
- 217=a top-side electrical contact contacting the p-type GaN
- 220=bottom-side tunneling-barrier epitaxially grown metal mirror (TB-GEMM)
- 221=tunneling and barrier layer (in some embodiments, this is doped, in other embodiments, this is intrinsically doped)
- 222=a buffer layer used to facilitate lattice matching to conductive substrate
- 225=a top-side optical-cavity epitaxially grown metal mirror (OC-GEMM)
- 226=a top-side electrical contact for contacting the OC-GEMM
- 227=a top-side electrical contact for contacting the TB-GEMM
- 228=a bottom-side electrical contact
- 229=an insulating substrate used in some embodiments
- 250=top-side TB-GEMM (thick or thin version)
- 255=bottom-side OC-GEMM
- 256=bottom-side p-type GaN for insulating substrate (alternatively n-type GaN)
- 260=top-side TB-GEMM (thin version)
- 261=the voltage ("VT") defined as the energy difference between the conduction sub-band 272 and the Fermi-energy level 270 in the p-type GaN
- 262=the energy ("hv") of the emitted photon, which is the energy difference between conduction sub-band energy level 272 and valence sub-band energy level 271
- 266=bottom-side p-type GaN for conductive substrate (alternatively n-type GaN)
- 270=Fermi-level energy in the p-type GaN
- 271=first valence sub-band in the active region
- 272=first conduction sub-band in the active region In some embodiments, electrons 99 flow (rightward relative to the energy-level diagram 201 of FIG. 2A, or upward relative to the devices 202, 203, 204 or 205 of FIG. 2B, FIG. 2C, FIG. 2D or FIG. 2E, respectively, or downward relative to the devices 206, 207, 208 or 209 of FIG. 2F, FIG. 2G, FIG. 2H or FIG. 2I, respectively) at a Fermi-energy level of the metal composition of TB-GEMM 220 (at or approximately at sub-band energy 272 in order that the electrons tunnel while remaining at the same energy level as on the other side of tunneling-barrier structure 221). Rather than dropping down in energy into quantum wells (e.g., as the electrons 99 do into QWs 114A, 114C and 114E of FIG. 1A), the electrons 99 in FIG. 2A tunnel through tunneling-barrier layer 221 (which allows quantum tunneling but is a barrier to regular electron flow) into quantum well 214A (and in devices having additional quantum wells, into QWs 214C, 214E and the like (in some embodiments, still further quantum wells are fabricated to the right of QW 214E), these electrons can also tunnel through the additional tunneling-barrier layers 214B, 214D and the like). The electrons in QWs 214A, 214C and 214E at energy level 272 will then combine with the holes 98 that have been flowing (leftward relative to the energy-level diagram 201 of FIG. 2A, or downward relative to the devices 202, 203, 204 or 205 of FIG. 2B, FIG. 2C, FIG. 2D or FIG. 2E, respectively, or upward relative to the devices 206, 207, 208 or 209 of FIG. 2F, FIG. 2G, FIG. 2H or FIG. 2I, respectively) (the electrons drop from sub-band energy level 272 to sub-band energy level 271) and each electron combining with a hole causes a photon to be emitted (having an energy 262 (=hv) of the emitted photon, which equal to the difference between sub-band energy level 272 and sub-band energy level 271).

FIG. 2B is a block diagram of an MQW device 202 having an insulative substrate 229, according to some embodiments of the present invention. In some embodiments, device 202 is formed by depositing a buffer layer 212 on substrate 229 to obtain a substrate structure 231. In some embodiments, TB-GEMM 220 is grown on substrate structure 231 such that the lattice structure of TB-GEMM 220 matches the lattice structure of substrate structure 231, in order that TB-GEMM 220 forms a well-ordered crystal template upon which a high-quality tunneling-barrier structure 221 and active layer 214 can be grown. In some embodiments, a conduction-type III-nitride layer 216 (e.g., in some embodiments, a p-type GaN semiconductor) is grown on active layer 214 (alternatively some embodiments use a p-type of some other III-nitride material); while in other embodiments, a different type of device (reversing the conductivity types) is fabricated in which the conductivity type is "n" such that an n-type III-nitride layer 216 is substituted), and a p-contact structure 217 is formed on III-nitride layer 216 to provide a compatible electrical contact for light-emitting MQW device 202. In some embodiments, such as shown in FIG. 2B, the other electrical contact 227 for light-emitting MQW device 202 is deposited on an upper-surface shelf of TB-GEMM structure 220. In some embodiments, the device 202 must be etched (e.g., using well-known reactive-ion-etching (RIE) techniques, or inductively coupled-plasma (ICP) etching techniques, or electron-cyclotron-resonance (ECR) etching techniques, or other suitable techniques, in order to expose the shelf on TB-GEMM 220 onto which electrical contact 227 is formed. In some embodiments, the shelf and contact 227 are made as small as possible while still providing a low-electrical-resistance contact, in order to maximize the exposed area of active region 214 from which light can be emitted. Similarly, in some embodiments, contact 217 is made as small as possible (and/or is made of thin and/or transparent material, such as indium-tin oxide (ITO)) while still providing a low-electrical-resistance contact, in order to maximize the exposed area of active region 214 from which light is emitted. Note that the region between line 2A and line 2A' in energy-level diagram of FIG. 2A corresponds to the physical region between line 2A and line 2A' in FIG. 2B. Note that in some embodiments of device 202, the light from active region 214 is emitted through the various layers and out the top of p-GaN layer 216 (and, if so configured, through at least a portion of electrical contact 217).

FIG. 2C is a block diagram of an MQW device 203 having a conductive substrate, according to some embodiments of the present invention. Device 203 is substantially the same as device 202 of FIG. 2A, except that substrate structure 232 of device 203 replaces substrate structure 231 of device 202. In some embodiments, electrically conducting substrate structure 232 includes an electrically conducting buffer layer 222 grown on an electrically conducting substrate 211, and at some point in processing, an electrical contact layer 228, which is formed on an opposite major face of substrate 211. This electrically conducting substrate structure 232, in some embodiments, provides a larger and lower-resistance electrical contact that does not require the loss of light-emitting area that occurs when using a top-side electrical contact 227 rather than bottom-side electrical contact 228. Other features of device 203 are the same as corresponding features of device 202. Note that the region between line 2A and line 2A' depicting energy levels in FIG. 2A corresponds to the physical region between line 2A and line 2A' in FIG. 2C.

FIG. 2D is a block diagram of an MQW device 204 having an insulative substrate and an optical cavity, according to some embodiments of the present invention. In some embodiments, device 204 is substantially the same as device 202 of FIG. 2B, except that an optical-cavity GEMM (OC-GEMM) structure 225 has been added on top of layer 216, and a compatible electrical contact 226 has been formed on OC-GEMM structure 225, both of which replace top-side p-contact structure 217 of FIG. 2B. In some embodiments, the thickness of the p-type III-nitride layer 216 is selected such that the active region 214 is positioned a first distance away from a first face of the OC-GEMM structure 225 (a mirror) such that the active region 214 is located at, or substantially at, an antinode of a first standing optical wave produced by interference of light emitted from the active region 214 with light reflected by the OC-GEMM structure 225 to form at least one extraction mode. In various embodiments, the active region 214, p-GaN region 216 and OC-GEMM structure 225 are configured in various ways described in more detail in copending U.S. patent application Ser. No. 11/882,730, filed Aug. 3, 2007, titled III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS (which issued as U.S. Pat. No. 7,915,624 on Mar. 29, 2011), which is incorporated herein by reference. Other features of device 204 are the same as corresponding features of device 202.

FIG. 2E is a block diagram of an MQW device 205 having a conductive substrate and an optical cavity, according to some embodiments of the present invention. In some embodiments, device 205 is substantially the same as device 203 of FIG. 2C, except that an optical-cavity GEMM (OC-GEMM) structure 225 has been added on top of p-GaN layer 216, and a compatible electrical contact 226 has been formed on OC-GEMM structure 225, both of which replace top-side p-contact structure 217 of FIG. 2C. In some embodiments, the thickness of the p-type III-nitride layer 216 is selected such that the active region 214 is positioned a first distance away from a first face of the OC-GEMM structure 225 (a mirror) such that the active region 214 is located at, or substantially at, an antinode of a first standing optical wave produced by interference of light emitted from the active region 214 with light reflected by the OC-GEMM structure 225 to form at least one extraction mode. Other features of device 205 are the same as corresponding features of devices 203 and 204 described above.

FIG. 2F is a block diagram of an MQW device 206 having an insulative substrate wherein light, in some embodiments, is emitted through the substrate. In some embodiments, device 206 is substantially the same as device 202 of FIG. 2B, except that TB-GEMM 250, tunneling barrier 221, active region 214 and bottom-side p-GaN layer 256 are deposited in the reverse order that top-side p-GaN layer 216, active region 214, tunneling barrier 221, and TB-GEMM structure 220 were deposited in device 202 described above. In some embodiments, bottom-side p-GaN layer 256 is grown on substrate structure 231 such that the lattice structure of bottom-side p-GaN layer 256 matches the lattice structure of substrate structure 231, in order that bottom-side p-GaN layer 256 forms a well-ordered crystal template upon which a high-quality active region 214 and tunneling-barrier structure 221 can be grown. In some embodiments, a conduction-type III-nitride layer 256 is grown on buffer layer 212 (e.g., in some embodiments, layer 256 is a p-type GaN semiconductor (alternatively some embodiments use a p-type of some other III-nitride material); while in other embodiments, a different type of device (reversing the conductivity types) is fabricated in which the conduction type is "n" such that an n-type III-nitride layer 256 is substituted). In some embodiments, active layer 214 is then formed, followed by growing tunneling barrier 221, and a TB-GEMM structure 250, onto which a contact 227 is deposited to provide a compatible electrical contact for light-emitting MQW device 206. In some embodiments, such as shown in FIG. 2F, the other electrical contact 217 for light-emitting MQW device 206 is deposited on an upper-surface shelf of p-GaN structure 256. In some embodiments, the device 206 is etched to expose the shelf of p-GaN structure 256 onto which electrical contact 217 is formed. In some embodiments, the shelf and contact 217 are made as small as possible while still providing a low-electrical-resistance contact, in order to maximize the exposed area of active region 214 from which light is emitted. In some embodiments that emit light out the bottom of device 206, contact 217 need not be made as small as possible while still providing a low-electrical-resistance contact, since active region 214 emits light out the bottom of device 206. Note that in some embodiments of device 206, the light from active region 214 is emitted through the various layers and out the bottom of substrate 229. Other features of device 206 are the same as corresponding features of device 202. Note that the region between line 2A and line 2A' in the energy-level diagram of FIG. 2A corresponds to the physical region between line 2A and line 2A' in FIG. 2F.

FIG. 2G is a block diagram of an MQW device 207 having a conductive substrate and a thin top-side GEMM structure 260 that allows light to be emitted through it and out the top of the device 207, according to some embodiments of the present invention. In some embodiments, device 207 is substantially the same as device 203 of FIG. 2C, except that TB-GEMM 260, tunneling barrier 221, active region 214 and bottom-side p-GaN layer 266 are deposited in the reverse order that top-side p-GaN layer 216, active region 214, tunneling barrier 221, and TB-GEMM structure 220 were deposited in device 203 described above. In some embodiments, bottom-side p-GaN layer 266 is grown on substrate structure 232 such that the lattice structure of bottom-side p-GaN layer 266 matches the lattice structure of substrate structure 232, in order that bottom-side p-GaN layer 266 forms a well-ordered crystal template upon which a high-quality active region 214 and tunneling-barrier structure 221 can be grown. In some embodiments, a conduction-type III-nitride layer 266 (e.g., in some embodiments, a p-type GaN semiconductor) is grown on buffer layer 222. In some embodiments, active layer 214 is then formed, followed by growing tunneling barrier 221, and a TB-GEMM structure 260, onto which a contact 227 is deposited to provide a compatible electrical contact for light-emitting MQW device 207. In some embodiments, such as shown in FIG. 2G, the other electrical contact 228 for light-emitting MQW device 207 is deposited on a bottom surface of substrate structure 232. In some embodiments, contact 227 is made as small as possible while still providing a low-electrical-resistance contact, in order to maximize the exposed area of active region 214 from which light can be emitted. Note that in some embodiments of device 207, the light from active region 214 is emitted through the various layers and out the top of thin top-side TB-GEMM structure 260. In other embodiments, light is emitted out the bottom when a suitable substrate (e.g., doped silicon carbide) is used for substrate 211. Other features of device 207 are the same as corresponding features of device 203. Note that the region between line 2A and line 2A' in the energy-level diagram of FIG. 2A corresponds to the physical region between line 2A and line 2A' in FIG. 2G.

FIG. 2H is a block diagram of an MQW device 208 having an insulative substrate structure 231, a thin bottom-side OC-GEMM structure 255 to form an optical cavity wherein light, in some embodiments, is emitted through the bottom-side OC-GEMM structure 255 and through the substrate structure 231, according to some embodiments of the present invention. Thus, in some embodiments, device 208 combines the top-side TB-GEMM of FIG. 2F with the OC-GEMM of FIG. 2D. In some embodiments, the top-side TB-GEMM structure 250 is made suitably thin in order to emit light out the top of device 208. In other embodiments, the bottom-side OC-GEMM structure 255 is made suitably thin in order to emit light out the bottom of device 208. In other embodiments, both TB-GEMM 250 and OC-GEMM 255 are made thin to emit light out both the top and bottom of device 208. Other features of device 208 are the same as corresponding features of devices 202, 204 or 206.

FIG. 2I is a block diagram of an MQW device 209 having a conductive substrate structure 232, a thin bottom-side OC-GEMM structure 255 to form an optical cavity with top-side TB-GEMM structure 260, wherein light, in some embodiments, is emitted through the bottom-side OC-GEMM structure 255 and the substrate structure 232, according to some embodiments of the present invention. Thus, in some embodiments, device 209 combines the top-side TB-GEMM of FIG. 2G with the OC-GEMM of FIG. 2E. In some embodiments, the top-side TB-GEMM structure 260 is made suitably thin in order to emit light out the top of device 209. In other embodiments, the bottom-side OC-GEMM structure 255 is made suitably thin in order to emit light out the bottom of device 209. Other features of device 209 are the same as corresponding features of devices 203, 205 or 207.

Figure 1C:
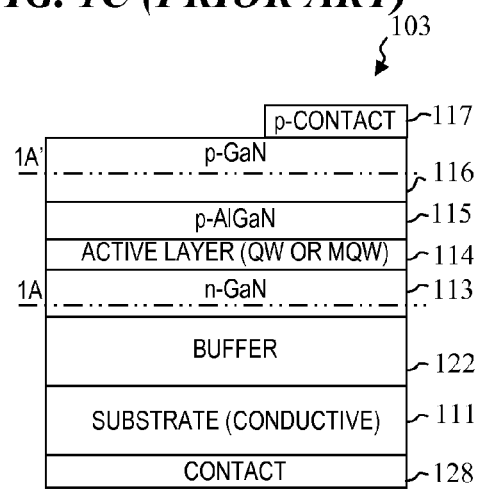
FIG. 1C is a block diagram of a prior-art MQW device 103 having a conductive substrate.

In some embodiments, the present invention enables the injection of electrons or holes into the active region 214 by tunneling through a tunneling barrier and at the electron or hole potential or sub-band energy of the active region, thereby reducing the required operating voltage, and relaxing the requirement for current-blocking layers (such as layer 115 of FIG. 1B) commonly used in the p-type side of conventional LED devices (e.g., as shown in FIGS. 1A, 1B and 1C). In some embodiments, lower LED operating voltages are favored for the benefits of reduced energy consumption. Moreover, less complex LED manufacturing processes are desired, which are achieved in some embodiments by eliminating the requirement for a p-type current-blocking layer (i.e., p-AlGaN layer 115 in FIG. 1A).

Conventional group III-Nitride LEDs require that electrons are injected into the semiconducting device such that the electrons are at the conduction-band minimum level of the n-type layer (99) as shown in FIG. 1A, and this level determines the applied voltage that is required to operate the LED. In some embodiments of the present invention, the electrons are injected directly at the active region electron potential (e.g., the sub-band energy) via quantum mechanical tunneling into the active region and therefore, the voltage required to operate the LED may be substantially lower than the voltage required to operate conventional LEDs. In some embodiments, the injected electrons are less likely to pass over the quantum wells into the p-type materials thereby eliminating or substantially reducing the number of electrons that are unintentionally injected into the p-type materials where their energy is lost in the form of heat generation.

In some embodiments, the present invention injects electrons directly at the electron potential (e.g., the sub-band energy level 272) of the active region and directly improves the device performance and reduces energy consumption by reducing the voltage required to drive or operate the LED. In some embodiments, the electron-potential level in the active region 214 is lower than that of the conduction-band minimum of the p-type layer (216). In some embodiments, an LED (202, 203) of the present invention emitting light at a wavelength of 520 nm, the operating voltage of the LED is reduced by approximately 1 Volt, or approximately 70% of a conventional LED operating voltage. In some embodiments, injecting electrons directly at the electron potential of the active region results in the electrons tunneling through one or more barriers (221, 214D, 214E) into the active region quantum wells (214A, 214B, 214C), and the operating voltage is reduced compared to a standard conventional LED, and the requirement for the p-type electron-blocking layer (e.g., p-AlGaN layer 115 in FIGS. 1A, 1B and 1C) is removed or relaxed.

In some embodiments, lower operating voltages achieved by the epitaxial/device structures of the present invention result in less heat generation and are thus preferred over the currently-existing conventional III-Nitride LEDs because lower heat generation is desired due to the negative effects heat has on device efficiency and the operational lifetime of an LED device.

In conventional LEDs, the p-type current-blocking layer (e.g., p-AlGaN 115 of FIG. 1A) is cumbersome to grow in epitaxial processes for several reasons (e.g., time, material costs, epitaxy chamber cleaning, device optimization during process development, and the like). In some embodiments, the present invention relaxes or removes the requirement for this current-blocking layer, due to the fact that charge carriers (i.e., electrons or holes) are less likely to pass the active region and get consumed in the semiconductor material located outside of the active region (e.g., p-type or n-type semiconductor materials).

In some embodiments, the present invention provides an LED structure based on a metallic current injector (e.g., TB-GEMM 220) and an active region 214 separated by a charge-carrier resonance-tunneling barrier 221. In some embodiments, the charge-carrier resonance-tunneling-barrier structure 221 is substantially transparent for quantum-tunneling electrons and is blocking for holes (thus the name "tunneling-barrier" structure). In some other embodiments, the charge-carrier resonance-tunneling barrier 221 is substantially transparent for quantum-tunneling holes and blocking for electrons. In some embodiments, the active region 214 includes a single-quantum-well (SQW) structure or a multiple-quantum-well (MQW) structure or a double heterojunction.

In some embodiments, resonance tunneling between the metal current injector (e.g., TB-GEMM 220) and an active region 214 may occur when the Fermi-energy potential of the metal current injector 220 is equal to, or substantially equal to, the energy potential of the sub-band minimum of the active region 214. In some embodiments, this is achieved by selecting both the active-region alloy composition and a suitable QW width in the active region and by selecting and/or adjusting the metal current injector 220 composition, thus modifying the associated work function of the material. In some embodiments, an interfacial layer is provided between the metal current injector 220 and the tunneling barrier 221 in order to depin the Fermi level of the tunneling barrier 221.

In some embodiments, it is important that thermally-activated holes do not tunnel into the metal current injector 220. In some embodiments, this is prevented or substantially reduced by appropriately adjusting the thickness of the charge-carrier resonance-tunneling barrier 221.

In some embodiments, the invention—an improved LED—injects electrons into the active region 214 at a lower energy by tunneling through a tunneling barrier 221. In some embodiments, the layer connected to the GaN—the source of the electrons into the GaN layer 221—is an epitaxially grown metal mirror (TB-GEMM) 220. In some embodiments, the TB-GEMM layer 220 is engineered to achieve a particular performance requirement or function and therefore can have various thicknesses and optical properties. In some embodiments, the TB-GEMM 220 is electrically conducting and possesses a work function appropriate for injecting electrons into the quantum well's conduction band or sub-band. In some embodiments, the TB-GEMM 220 includes one or more of the materials including Hf, Zr, $HfB_2$, $ZrB_2$, $HfN_x$, or $ZrN_x$, or the like, or any combined compound or composition or combination of these materials. In some embodiments, any material that is electrically conductive and a metal with an appropriate work function as described above are used for the TB-GEMM 220 layer. In some embodiments, the material of the TB-GEMM 220 is lattice matched to the epitaxial structure of the LED device. In some embodiments, the tunneling barrier layer 221 has an appropriate doping level (n or p) to allow for injecting electrons or holes into the quantum well's conduction band or sub-band minimum and assists in blocking charge carriers from traveling from the active layer 214 into the metal layer 220. One such version is shown in FIGS. 2A, 2B and 2C. FIG. 1A and FIG. 2A can be used to compare the required potentials (V1 161 and V2 261) to drive the LEDs (i.e., V1 161 of FIG. 1A is greater than V2 261 of FIG. 2A).

In some embodiments, due to the structure of the LED as described in FIGS. 2A, 2B and 2C, a blocking layer (e.g., the p-AlGaN layer 115 as shown in FIG. 1A) is optionally included to block electrons in the quantum-well region because fewer electrons travel past the QW. In some embodiments, the p-type layer 216 in FIGS. 2A, 2B and 2C includes p-GaN, p-AlGaN, p-InGaN, p-InGaAlN p-HfGaN, p-ZrGaN, and/or ScAlGaN, or the like, or any suitable variation of multiple layers mentioned herein.

In some embodiments, the active region 214 in FIGS. 2A, 2B and 2C includes GaN, AlGaN, InGaN, InGaAlN HfGaN, ZrGaN, and/or ScAlGaN, or the like, or any variation of multiple layers mentioned herein and, in some embodiments, the active region 214 is doped with silicon or magnesium or the like.

In some embodiments, the tunneling barrier layer 221 and/or the additional barrier layers (214B and 214D) in FIG. 2A include GaN, AlGaN, InGaN, InGaAlN HfGaN, ZrGaN, or ScAlGaN, and/or the like, or any variation of multiple layers mentioned herein, and in some embodiments, the tunneling barrier layer 221 is doped with silicon or magnesium or the like.

In some embodiments, the layers 214A, 214C, 214E in FIGS. 2B-2I are used as either quantum wells or lower-electron-potential layers in order to assist in the electron tunneling from the metal layer (TB-GEMM 220) into the active-region quantum wells (214A, 214C, 214E and the like). In some embodiments, the quantum well (214E) nearest to the p-type materials generally has the largest population of the combination of electrons and holes, and its position with respect to the metal layer (220) and its position with respect to the light-exiting surface of the device, as described in U.S. patent application Ser. No. 11/882,730, are critical to some embodiments of the device design. In some embodiments, any suitable number of tunneling barriers 214B, 214D and lower-electron-potential layers/quantum wells 214A, 214C, 214E are used to separate the primary active region (e.g., the last quantum well 214E) at a suitable distance from the metal layer (TB-GEMM 220) to improve light extraction, as described in U.S. patent application Ser. No. 11/882,730, which is incorporated herein by reference.

In some embodiments, the TB-GEMM layer (220) is grown on silicon (Si), sapphire (single-crystal $Al_2O_3$), GaN/Sapphire, SiC, or ZnO or any other suitable lattice-matched substrate. In some embodiments, the GEMM layer (220) is grown on a non-lattice-matched substrate and/or glass. In some embodiments, the invention utilizes microcavity effects which depend on the distance between the GEMM and the active region, as described in U.S. patent application Ser. No. 11/882,730, which is incorporated herein by reference.

FIG. 3A is an energy-level diagram 301 of an MQW device 302 or 303, according to some embodiments of the present invention. In FIGS. 3A-3I, most of the reference numbers are the same as described above for FIGS. 2A-2I, wherein the following additional reference number which refers to:

323=insulating interfacial layer

In FIG. 3A, energy-level diagram 301 includes a representation of interfacial insulating layer 323. In some embodiments, interfacial insulating layer 323 is used to "depin" the Fermi-energy level of the tunneling barrier 221 (e.g., passivate its surface states, dangling bonds, and reduce or eliminate MIGS (metal-induced gap states, as described above)), in order to allow the metal work function of the TB-GEMM 220 to properly align with the sub-band-energy level 272 of the MQW 214. All other aspects of FIGS. 3A-3I are as described above for the corresponding FIGS. 2A-2I.

FIG. 3B is a block diagram of an MQW device 302 having an interfacial insulating layer 323, as described above for FIG. 3A, according to some embodiments of the present invention. All other aspects of FIG. 3B are as described above for FIG. 2B.

FIG. 3C is a block diagram of an MQW device 303 having an interfacial insulating layer 323, as described above for FIG. 3A, according to some embodiments of the present invention. All other aspects of FIG. 3C are as described above for FIG. 2C.

FIG. 3D is a block diagram of an MQW device 304 having an interfacial insulating layer 323, as described above for FIG. 3A, according to some embodiments of the present invention. All other aspects of FIG. 3D are as described above for FIG. 2D.

FIG. 3E is a block diagram of an MQW device 305 having an interfacial insulating layer 323, as described above for FIG. 3A, according to some embodiments of the present invention. All other aspects of FIG. 3E are as described above for FIG. 2E.

FIG. 3F is a block diagram of an MQW device 306 having an interfacial insulating layer 323, as described above for FIG. 3A, according to some embodiments of the present invention. All other aspects of FIG. 3F are as described above for FIG. 2F.

FIG. 3G is a block diagram of an MQW device 307 having an interfacial insulating layer 323, as described above for FIG. 3A, according to some embodiments of the present invention. All other aspects of FIG. 3G are as described above for FIG. 2G.

FIG. 3H is a block diagram of an MQW device 308 having an interfacial insulating layer 323, as described above for FIG. 3A, according to some embodiments of the present invention. All other aspects of FIG. 3H are as described above for FIG. 2H.

FIG. 3I is a block diagram of an MQW device 309 having an interfacial insulating layer 323, as described above for FIG. 3A, according to some embodiments of the present invention. All other aspects of FIG. 3I are as described above for FIG. 2I.

In some embodiments of each of the other embodiments described herein, an interfacial insulating layer 323, as described above for FIG. 3A, is added in a similar manner.

FIG. 4A is an energy-level diagram 401 of an MQW device 402 or 403 that includes a blocking layer 418, according to some embodiments of the present invention. In some embodiments, blocking layer 418 is a p-doped AlGaN layer (or a corresponding p-type or n-type layer if other semiconducting materials are used). In some embodiments, blocking layer 418 has a suitably increased bandgap energy to prevent carriers from traversing beyond the quantum wells 214A-214E (preventing movement further to the right in the FIG. 4A). In some embodiments, this increases the recombination efficiency. All other aspects of FIGS. 4A-4I are as described above for the corresponding FIGS. 2A-2I. In some embodiments of each of the other embodiments described herein, a blocking layer 418, as described above for FIG. 4A, is added in a similar manner.

FIG. 4B is a block diagram of an MQW device 402, having a blocking layer 418, as described above for FIG. 4A, according to some embodiments of the present invention. All other aspects of FIG. 4B are as described above for FIG. 2B.

FIG. 4C is a block diagram of an MQW device 403 having a blocking layer 418, as described above for FIG. 4A, according to some embodiments of the present invention. All other aspects of FIG. 4C are as described above for FIG. 2C.

FIG. 4D is a block diagram of an MQW device 404 having a blocking layer 418, as described above for FIG. 4A, according to some embodiments of the present invention. All other aspects of FIG. 4D are as described above for FIG. 2D.

FIG. 4E is a block diagram of an MQW device 405 having a blocking layer 418, as described above for FIG. 4A, according to some embodiments of the present invention. All other aspects of FIG. 4E are as described above for FIG. 2E.

FIG. 4F is a block diagram of an MQW device 406 having a blocking layer 418, as described above for FIG. 4A, according to some embodiments of the present invention. All other aspects of FIG. 4F are as described above for FIG. 2F.

FIG. 4G is a block diagram of an MQW device 407 having a blocking layer 418, as described above for FIG. 4A, according to some embodiments of the present invention. All other aspects of FIG. 4G are as described above for FIG. 2G.

FIG. 4H is a block diagram of an MQW device 408 having a blocking layer 418, as described above for FIG. 4A, according to some embodiments of the present invention. All other aspects of FIG. 4H are as described above for FIG. 2H.

FIG. 4I is a block diagram of an MQW device 409 having a blocking layer 418, as described above for FIG. 4A, according to some embodiments of the present invention. All other aspects of FIG. 4I are as described above for FIG. 2I.

Figure 5A:
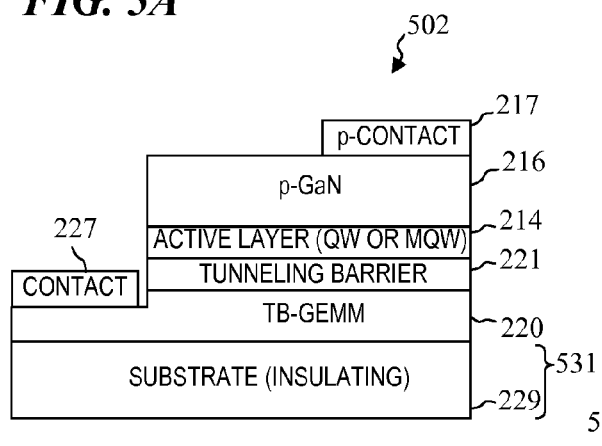
FIG. 5A is a block diagram of an MQW device 502 having an insulative substrate, according to some embodiments of the present invention.

FIG. 5A is a block diagram of an MQW device 502 having a TB-GEMM 220 grown directly on substrate 229 (wherein substrate 229 forms substrate structure 531 without a buffer layer), according to some embodiments of the present invention. All other aspects of FIG. 5A are as described above for FIG. 2B. This reduces a process step for those embodiments in which a high-quality TB-GEMM 220 can be grown without a buffer layer. In some embodiments of each of the other embodiments described herein, TB-GEMM 220 is grown without a buffer layer, when it is suitable.

Figure 5B:
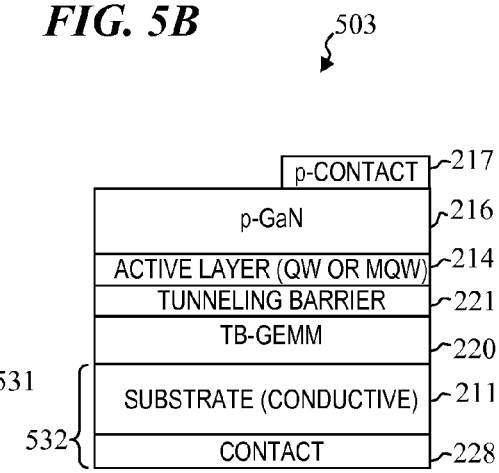
FIG. 5B is a block diagram of an MQW device 503 having a conductive substrate, according to some embodiments of the present invention.

FIG. 5B is a block diagram of an MQW device 503 having a conductive substrate, and having a TB-GEMM 220 grown directly on substrate 211 (wherein substrate 211 and contact 228 (which is, in some embodiments, formed in a subsequent process step) form substrate structure 532 without a buffer layer), according to some embodiments of the present invention. All other aspects of FIG. 5B are as described above for FIG. 2C.

Figure 6A:
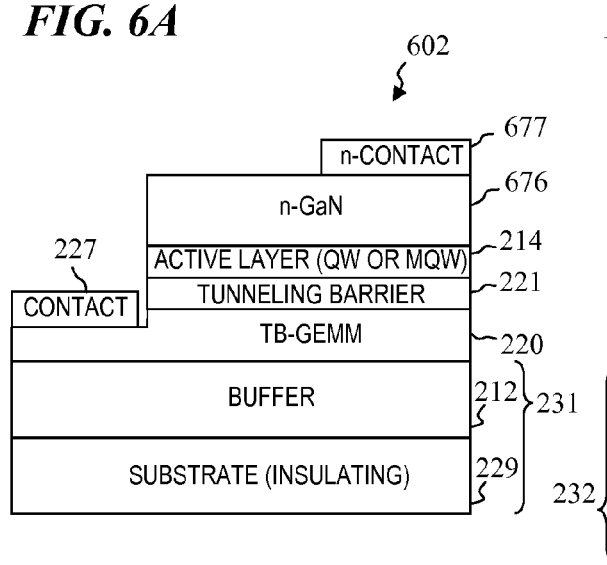
FIG. 6A is a block diagram of an MQW device 602 having an insulative substrate, according to some embodiments of the present invention.

FIG. 6A is a block diagram of an MQW device 602 having an n-type GaN layer 676 in place of the corresponding p-type GaN layer 216 of FIG. 2B, according to some embodiments of the present invention. Additionally, in some embodiments, n-contact 677 is used to provide a suitable low-resistance electrical contact to n-type GaN layer 676. All other aspects of FIG. 6A are as described above for FIG. 2B. This provides an alternative diode structure for those embodiments in which a highly-doped n-type GaN is suitable (since highly-doped n-type GaN is more readily achieved than highly-doped p-type GaN). In some embodiments of each of the other embodiments described herein, such an n-type GaN layer 676 replaces the corresponding p-type GaN layer 216.

Figure 6B:
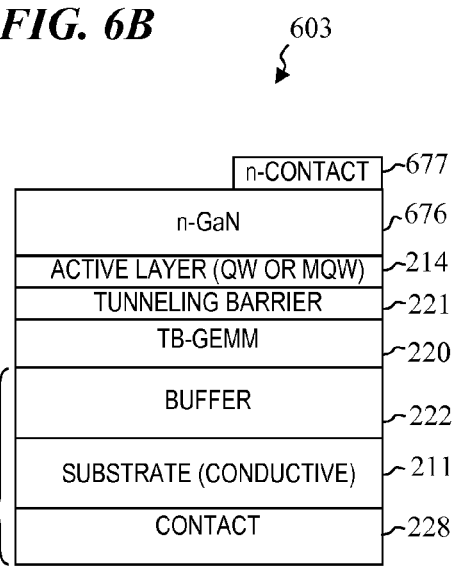
FIG. 6B is a block diagram of an MQW device 603 having a conductive substrate, according to some embodiments of the present invention.

FIG. 6B is a block diagram of an MQW device 603 having a conductive substrate structure 232, and having an n-type GaN layer 676 in place of the corresponding p-type GaN layer 216 of FIG. 2C, according to some embodiments of the present invention. All other aspects of FIG. 6B are as described above for FIG. 2C.

Figure 7A:
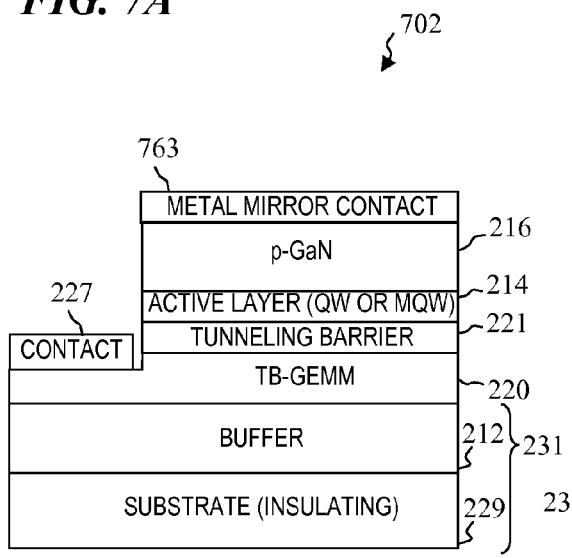
FIG. 7A is a block diagram of an MQW device 702 having an insulative substrate, according to some embodiments of the present invention.

FIG. 7A is a block diagram of an MQW device 702 having a metal-mirror 763 that reflects light and provides electrical contact to p-type GaN layer 216, and optionally creates an optical cavity between metal-mirror 763 and TB-GEMM 220, according to some embodiments of the present invention. In some such embodiments, light is output through the bottom side of device 702. All other aspects of FIG. 7A are as described above for FIG. 2B. Some embodiments of each of the other embodiments described herein use such a metal-mirror 763.

Figure 7B:
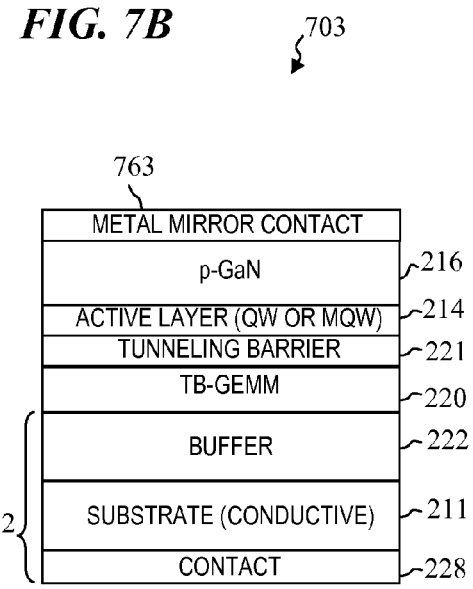
FIG. 7B is a block diagram of an MQW device 703 having a conductive substrate, according to some embodiments of the present invention.

FIG. 7B is a block diagram of an MQW device 703 having a conductive substrate structure 232 and having a metal-mirror 763, according to some embodiments of the present invention. All other aspects of FIG. 7B are as described above for FIG. 2C.

Figure 8A:
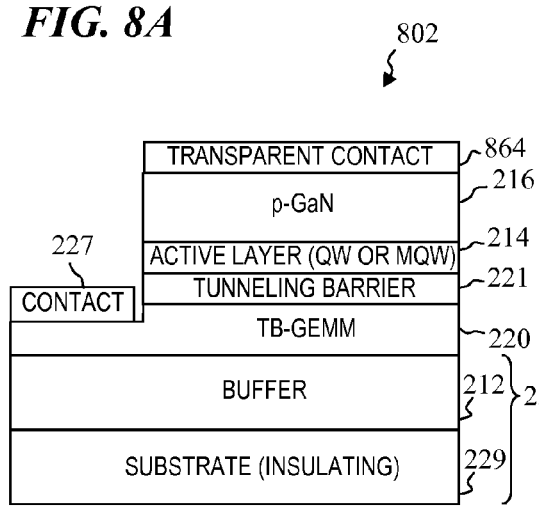
FIG. 8A is a block diagram of an MQW device 802 having an insulative substrate, according to some embodiments of the present invention.

FIG. 8A is a block diagram of an MQW device 802 having a transparent electrical contact 864 that transmits light and provides electrical contact to p-type GaN layer 216, and optionally creates an optical cavity (due to reflections from the interface between transparent electrical contact 864 and p-type GaN layer 216, or between transparent electrical contact 864 and a layer above it), according to some embodiments of the present invention. In some such embodiments, light is output through the top side of device 802. All other aspects of FIG. 8A are as described above for FIG. 2B. In some embodiments of each of the other embodiments described herein, such a transparent electrical contact 864 is used.

Figure 8B:
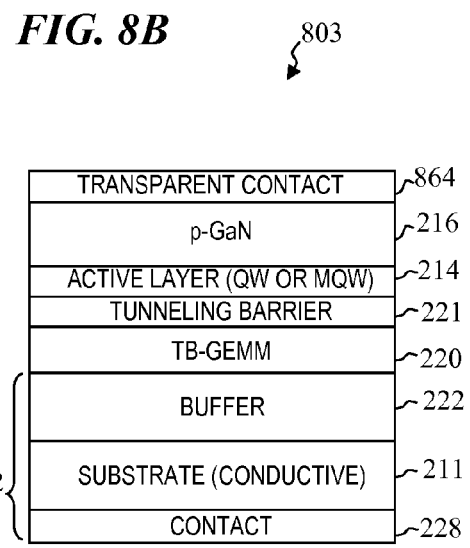
FIG. 8B is a block diagram of an MQW device 803 having a conductive substrate, according to some embodiments of the present invention.

FIG. 8B is a block diagram of an MQW device 803 having a conductive substrate, and a transparent electrical contact 864 that transmits light and provides electrical contact to p-type GaN layer 216, and optionally creates an optical cavity (due to reflections from the interface between transparent electrical contact 864 and p-type GaN layer 216, or between transparent electrical contact 864 and a layer above it), according to some embodiments of the present invention. In some such embodiments, light is output through the top side of device 803. All other aspects of FIG. 8B are as described above for FIG. 2C.

Figure 9A:
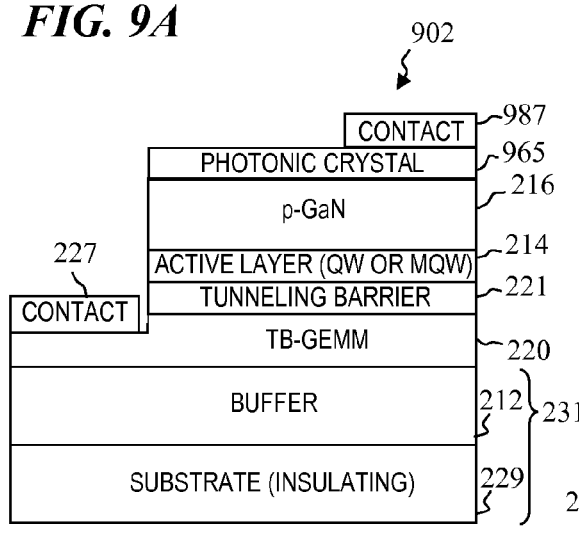
FIG. 9A is a block diagram of an MQW device 902 having an insulative substrate, according to some embodiments of the present invention.

FIG. 9A is a block diagram of an MQW device 902 having a photonic-crystal layer 965 that enhances light output and direction, according to some embodiments of the present invention. In some embodiments, photonic-crystal layer 965 is electrically conductive and the top electrical contact 987 is as shown. In other embodiments, an area of photonic-crystal layer 965 is removed such that top electrical contact 987 is connected directly to top p-GaN layer 216. In some embodiments, photonic-crystal layer 965 is not a separate layer, but instead the photonic-crystal structure is formed in top p-GaN layer 216. In some such embodiments, light is output through the top side of device 902. All other aspects of FIG. 9A are as described above for FIG. 2B. In some embodiments of each of the other embodiments described herein, such a photonic-crystal layer 965 and top electrical contact 987 are used.

Figure 9B:
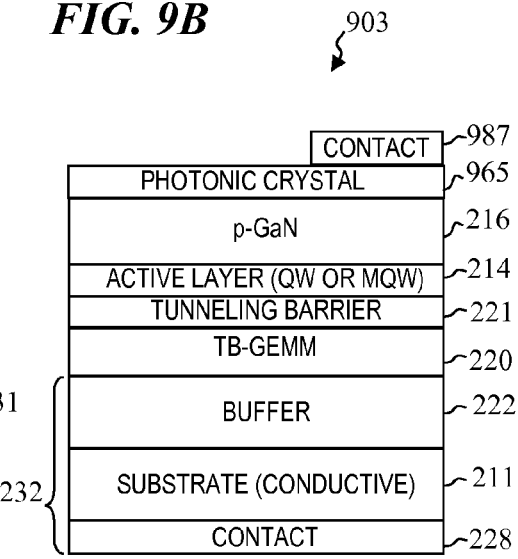
FIG. 9B is a block diagram of an MQW device 903 having a conductive substrate, according to some embodiments of the present invention.

FIG. 9B is a block diagram of an MQW device 903 having a conductive substrate, a photonic-crystal layer 965 and a top electrical contact 987, according to some embodiments of the present invention. In some such embodiments, light is output through the top side of device 903. All other aspects of FIG. 9B are as described above for FIG. 2C.

Figure 10:
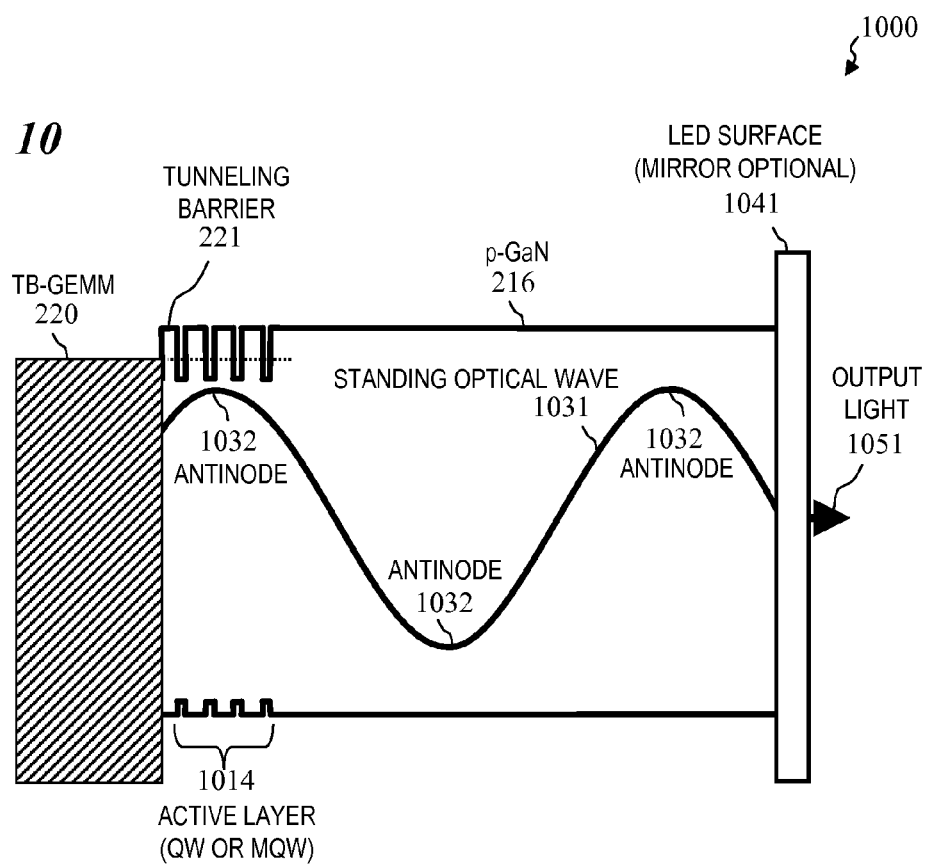
FIG. 10 is an energy-level diagram 1000 of an MQW device, according to some embodiments of the present invention.

FIG. 10 is an energy-level diagram 1000 of an MQW device, according to some embodiments of the present invention. In some embodiments, a standing wave 1031 is formed by the constructive interference of light emitted by active layer 1014 and light reflected by mirror 1041 such that an antinode 1032 of standing wave 1031 is located at, or substantially at, active layer 1014. This advantageous technique is described in detail in U.S. patent application 11/882,730, filed Aug. 3, 2007, titled III-NITRIDE LIGHT-EMITTING DEVICES WITH ONE OR MORE RESONANCE REFLECTORS AND REFLECTIVE ENGINEERED GROWTH TEMPLATES FOR SUCH DEVICES, AND METHODS (which issued as U.S. Pat. No. 7,915,624 on Mar. 29, 2011), which is incorporated herein by reference.

Figure 11:
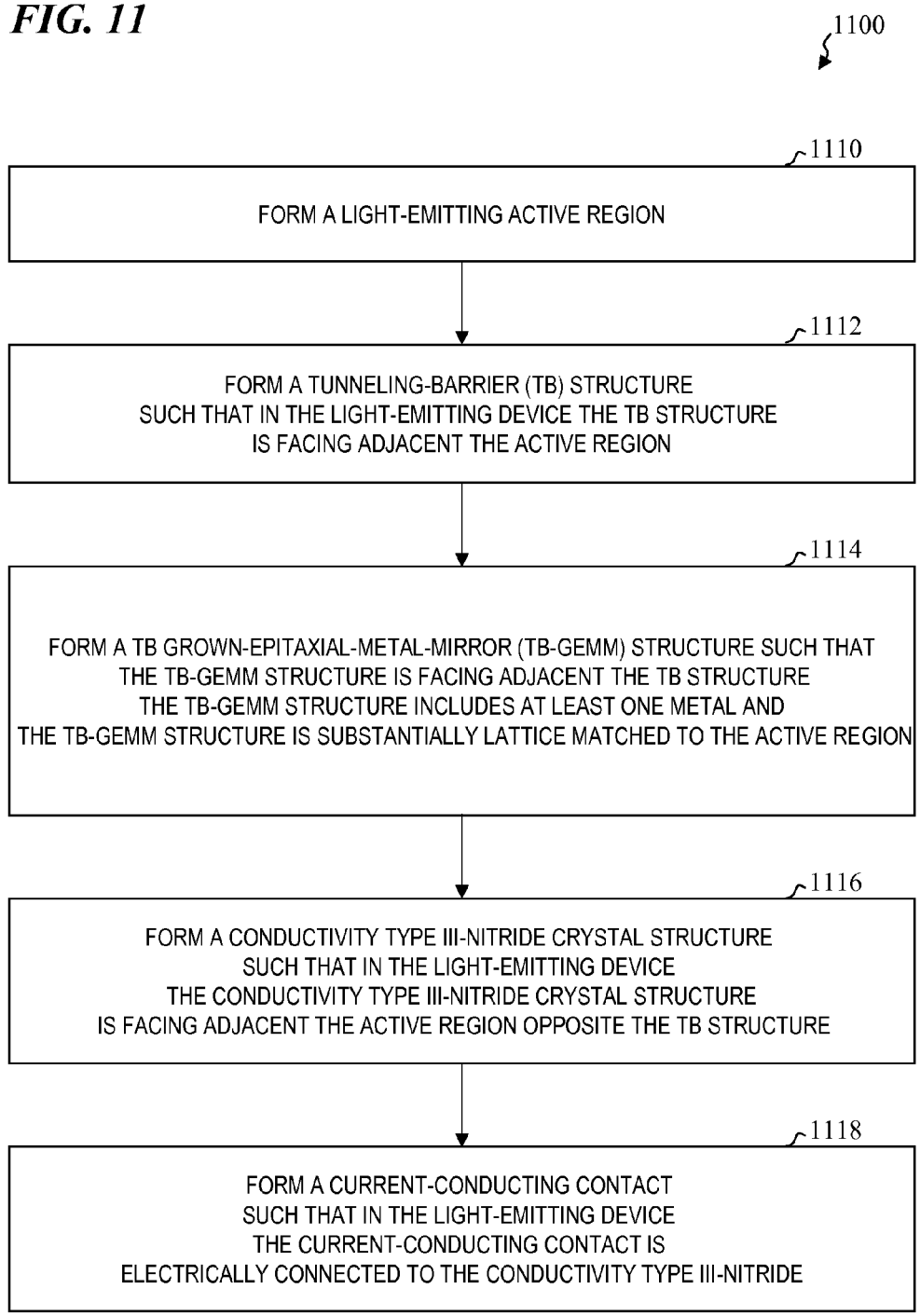
FIG. 11 is a flow chart of one method 1100 according to some embodiments of the present invention.

FIG. 11 is a flow chart of a method 1100 of making a light-emitting device according to some embodiments of the invention. In some embodiments, method 1100 includes forming 1110 a light-emitting active region, forming 1112 a tunneling-barrier (TB) structure such that in the light-emitting device the TB structure is facing adjacent the active region, forming 1114 a TB grown-epitaxial-metal-mirror (TB-GEMM) structure such that in the light-emitting device the TB-GEMM structure is facing adjacent the TB structure, wherein the TB-GEMM structure includes at least one metal and wherein the TB-GEMM structure is substantially lattice matched to the active region, and forming 1116 a conductivity type III-nitride crystal structure such that in the light-emitting device the conductivity type III-nitride crystal structure is facing adjacent the active region opposite the TB structure. Some embodiments further include forming 1118 a current-conducting contact such that in the light-emitting device the current-conducting contact is electrically connected to the conductivity type III-nitride.

In some embodiments, the present invention provides an apparatus that includes a light-emitting device having a light-emitting active region, a tunneling-barrier (TB) structure facing adjacent the active region, a TB grown-epitaxial-metal-mirror (TB-GEMM) structure facing adjacent the TB structure, wherein the TB-GEMM structure includes at least one metal and is substantially lattice-matched to the active region, a conductivity-type III-nitride crystal structure adjacent facing the active region opposite the TB structure. Some embodiments further include a current-conducting contact electrically connected to the conductivity-type III-nitride structure.

In some embodiments of the apparatus, the active region includes a multiple-quantum-well (MQW) structure.

In some embodiments of the apparatus, the MQW structure of the active region includes quantum-well widths selected to provide a selected sub-band minimum energy potential, and the TB-GEMM structure includes an alloy composition such that metal current injectors have a Fermi energy potential that is substantially equal to the sub-band minimum energy potential of the MQW.

In some embodiments of the apparatus, the light-emitting device further includes a second mirror that is facing adjacent the conductivity-type III-nitride structure and facing the TB-GEMM structure to form an optical cavity between the second mirror and the TB-GEMM structure, wherein the active region is within the optical cavity. In particular, in some embodiments of the light-emitting device, the second mirror includes an optical-cavity grown-epitaxial-metal-mirror (OC-GEMM) structure facing adjacent the conductivity-type III-nitride structure such that the device has an optical cavity between the OC-GEMM structure and the TB-GEMM structure, wherein the active region is within the optical cavity. In some such embodiments, the active region is positioned a first distance away from a first face of the second mirror such that the active region is located at or substantially at an antinode of a first standing optical wave produced by interference of light emitted from the active region with light reflected by the second mirror to form at least one extraction mode.

In some embodiments of the apparatus, the light-emitting device further includes a substrate structure, wherein the TB-GEMM structure is facing touching the substrate structure and is substantially lattice matched to a face of the substrate structure.

In some embodiments of the apparatus that have an OC-GEMM, the light-emitting device further includes a substrate structure, wherein the OC-GEMM structure is facing touching the substrate structure and is substantially lattice matched to a face of the substrate structure.

In some embodiments of the apparatus, the TB-GEMM structure and/or the OC-GEMM structure includes a compound that includes $(Hf_xZr_yTi_z)R$ where $x+y+z=1$ and where x is between 0 and 1, inclusive, and where y is between 0 and 1, inclusive, and where z is between 0 and 1, inclusive, and wherein R is N or $B_2$. In other embodiments, the TB-GEMM structure and/or the OC-GEMM structure includes just Hf, just Zr, just Ti, or a combination of two or more of Hf, Zr, and/or Ti.

Some embodiments further include an insulating interfacial layer located between the TB-GEMM structure and the TB structure.

In some embodiments of the apparatus, the light-emitting device further includes an interfacial insulating layer. In some embodiments, the interfacial insulating layer is used to "depin" the Fermi-energy level of the tunneling barrier (e.g., passivate its surface states, dangling bonds, and reduce or eliminate MIGS (metal-induced gap states, as described above)), in order to allow the metal work function of the TB-GEMM to properly align with the sub-band-energy level of the MQW.

In some embodiments of the apparatus, the light-emitting device further includes a blocking layer. In some embodiments, the blocking layer is a p-doped AlGaN layer. In other embodiments, the blocking layer is a corresponding p-type or n-type layer if other semiconducting materials are used. In some embodiments, the blocking layer has a suitably increased bandgap energy to prevent carriers from traversing beyond the quantum wells. In some embodiments, this increases the recombination efficiency.

In some embodiments of the apparatus, the light-emitting device further includes a TB-GEMM that is grown directly on the substrate (wherein the substrate structure does not include a buffer layer). This reduces a process step for those embodiments in which a high-quality TB-GEMM can be grown without a buffer layer.

In some embodiments of the apparatus, the light-emitting device further includes a substrate structure that does include a buffer layer such that a high-quality TB-GEMM can be grown on a substrate that does not provide this result without a buffer layer.

In some embodiments of the apparatus, the light-emitting device further includes an n-type GaN layer in place of the corresponding p-type GaN layer of other embodiments of the present invention. Additionally, in some embodiments, an additional n-contact is used to provide a suitable low-resistance electrical contact to the n-type GaN layer. This provides an alternative diode structure for those embodiments in which a highly-doped n-type GaN is suitable (since highly-doped n-type GaN is more readily achieved than highly-doped p-type GaN).

In some embodiments of the apparatus, the light-emitting device further includes a metal-mirror that reflects light and provides electrical contact to the p-type GaN layer, and optionally creates an optical cavity between the metal-mirror and the TB-GEMM. In some such embodiments, light is output through the bottom side of the light-emitting device.

In some embodiments of the apparatus, the light-emitting device further includes a transparent electrical contact that transmits light and provides electrical contact to the p-type GaN layer, and optionally creates an optical cavity (due to reflections from the interface between the transparent electrical contact and the p-type GaN layer, or between the transparent electrical contact and a layer above it). In some such embodiments, light is output through the top side of the light-emitting device.

In some embodiments, the apparatus further includes an electrical power supply that supplies electrical power to the light emitting device, as well as other aspects of an overall system (e.g., the components of a high-definition television, laser printer, street light, traffic semaphore stop lights, automobile headlights, and other lighting and/or functional equipment that utilizes the light output of the light emitting device.

In some embodiments of the apparatus, the light-emitting device further includes a photonic-crystal layer that enhances light output and direction. In some embodiments, the photonic-crystal layer is electrically conductive and a top electrical contact is added on it. In other embodiments, the photonic-crystal layer is removed such that a top electrical contact is connected directly to the top p-GaN layer. In some embodiments, the photonic-crystal structure is not a separate layer, but instead is formed in the top p-GaN layer. In some such embodiments, light is output through the top side of the light-emitting device.

In some embodiments, the present invention provides a method for making a light-emitting device. This method includes forming a light-emitting active region, forming a tunneling-barrier (TB) structure such that in the light-emitting device the TB structure is facing adjacent the active region, forming a TB grown-epitaxial-metal-mirror (TB-GEMM) structure such that in the light-emitting device the TB-GEMM structure is facing adjacent the TB structure, wherein the TB-GEMM structure includes at least one metal and wherein the TB-GEMM structure is substantially lattice matched to the active region, forming a conductivity type III-nitride crystal structure such that in the light-emitting device the conductivity type III-nitride crystal structure is facing adjacent the active region opposite the TB structure. Some embodiments further include forming a current-conducting contact such that in the light-emitting device the current-conducting contact is electrically connected to the conductivity type III-nitride.

In some embodiments of the method, the forming of the active region includes forming a multiple-quantum-well (MQW) structure.

In some embodiments of the method, the forming of the MQW structure of the active region includes forming quantum-well widths selected to provide a selected sub-band minimum energy potential, and the TB-GEMM structure includes an alloy composition such that metal current injectors have a Fermi energy potential that is substantially equal to the sub-band minimum energy potential of the MQW.

Some embodiments of the method further include forming a second mirror such that in the light-emitting device the second mirror is facing adjacent the conductivity-type III-nitride structure and facing the TB-GEMM structure to form an optical cavity between the second mirror and the TB-GEMM structure, wherein the active region is within the optical cavity.

Some embodiments of the method further include forming a second mirror comprising an optical-cavity grown-epitaxial-metal-mirror (OC-GEMM) structure, such that in the light-emitting device the OC-GEMM structure is facing adjacent the conductivity-type III-nitride structure and forms an optical cavity between the OC-GEMM structure and the TB-GEMM structure, wherein the active region is within the optical cavity.

In some embodiments of the method, the light-emitting device is formed such that in the light-emitting device the active region is located a first distance away from a first face of the second mirror such that the active region is located at or substantially at an antinode of a first standing optical wave produced by interference of light emitted from the active region with light reflected by the second mirror to form at least one extraction mode.

Some embodiments of the method further include providing a substrate structure, and forming the TB-GEMM structure on, and facing touching, the substrate structure and is substantially lattice matched to a face of the substrate structure.

Some embodiments of the method further include providing a substrate structure, and forming the OC-GEMM structure on, and facing touching, the substrate structure and is substantially lattice matched to a face of the substrate structure.

In some embodiments of the method, the TB-GEMM structure includes a compound that includes $(Hf_xZr_yTi_z)R$ where $x+y+z=1$ and where x is between 0 and 1, inclusive, and where y is between 0 and 1, inclusive, and where z is between 0 and 1, inclusive, and wherein R is N or $B_2$. In other embodiments, the TB-GEMM structure and/or the OC-GEMM structure includes just Hf, just Zr, just Ti, or a combination of two or more of Hf, Zr, and/or Ti.

Some embodiments of the method further include forming an insulating interfacial layer such that in the light-emitting device the interfacial layer is located between the TB-GEMM structure and the TB structure.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method for making a light-emitting device, the method comprising:
    forming a light-emitting active region;
    forming a tunneling-barrier (TB) structure such that in the light-emitting device the TB structure is facing adjacent the active region;
    forming a TB grown-epitaxial-metal-mirror (TB-GEMM) structure such that in the light-emitting device the TB-GEMM structure is facing adjacent the TB structure, wherein the TB-GEMM structure includes at least one metal and wherein the TB-GEMM structure is substantially lattice matched to the active region;
    forming a conductivity type III-nitride crystal structure such that in the light-emitting device the conductivity type III-nitride crystal structure is facing adjacent the active region opposite the TB structure; and
    forming a current-conducting contact such that in the light-emitting device the current-conducting contact is electrically connected to the conductivity type III-nitride.

2. The method of claim 1, wherein the forming of the active region includes forming a multiple-quantum-well (MQW) structure.

3. The method of claim 2,
    wherein the forming of the MQW structure of the active region includes forming quantum-well widths selected to provide a selected sub-band minimum energy potential, and
    wherein the TB-GEMM structure includes an alloy composition such that metal current injectors have a Fermi energy potential that is substantially equal to the sub-band minimum energy potential of the MQW.

4. The method of claim 1, further comprising forming a second mirror such that in the light-emitting device the second mirror is facing adjacent the conductivity-type III-nitride structure and facing the TB-GEMM structure to form an optical cavity between the second minor and the TB-GEMM structure, wherein the active region is within the optical cavity.

5. The method of claim 1, further comprising forming a second mirror comprising an optical-cavity grown-epitaxial-metal-mirror (OC-GEMM) structure, such that in the light-emitting device the OC-GEMM structure is facing adjacent the conductivity-type III-nitride structure and forms an optical cavity between the OC-GEMM structure and the TB-GEMM structure, wherein the active region is within the optical cavity.

6. The method of claim 4, wherein the light-emitting device is formed such that in the light-emitting device the active region is located a first distance away from a first face of the second minor such that the active region is located at or substantially at an antinode of a first standing optical wave produced by interference of light emitted from the active region with light reflected by the second minor to form at least one extraction mode.

7. The method of claim 1, wherein the method further comprises:
    providing a substrate structure; and
    forming the TB-GEMM structure on, and facing touching, the substrate structure and is substantially lattice matched to a face of the substrate structure.

8. The method of claim 5, wherein the method further comprises:
    providing a substrate structure; and
    forming the OC-GEMM structure on, and facing touching, the substrate structure, wherein the OC-GEMM structure is substantially lattice matched to a face of the substrate structure.

9. The method of claim 1, wherein the TB-GEMM structure comprises:
    a compound that includes $(Hf_xZr_yTi_z)R$ where $x+y+z=1$ and where x is between 0 and 1, inclusive, and where y is between 0 and 1, inclusive, and where z is between 0 and 1, inclusive, and wherein R is N or B2.

10. The method of claim 1, further comprising forming an insulating interfacial layer such that in the light-emitting device the interfacial layer is located between the TB-GEMM structure and the TB structure.

11. A method for fabricating a light-emitting device, the method comprising:
    providing a substrate having a top-side and a bottom-side;
    epitaxially growing a tunneling-barrier (TB) grown-epitaxial-metal-mirror (TB-GEMM) structure on at least a portion of the top-side of the substrate;
    epitaxially growing a TB structure on at least a portion of the TB-GEMM structure;
    epitaxially growing a light-emitting active region on at least a portion of the TB structure; and
    epitaxially growing a conductivity type III-nitride structure on at least a portion of the light-emitting active region.

12. The method of claim 11, further comprising:
    forming a buffer layer on at least a portion of the top-side of the substrate prior to the epitaxially growing of the TB-GEMM structure, such that the buffer layer is located between the top-side of the substrate and the TB-GEMM structure.

13. The method of claim 12, further comprising:
    forming a first current-conducting contact on at least a portion of the conductivity type III-nitride structure; and
    forming a second current-conducting contact on at least a portion of the TB-GEMM structure.

14. The method of claim 12, further comprising:
    forming a first current-conducting contact on at least a portion of the conductivity type III-nitride structure; and
    forming a second current-conducting contact on at least a portion of the bottom-side of the substrate.

15. The method of claim 12, wherein the epitaxially growing of the light-emitting active region includes epitaxially growing a multiple-quantum-well (MQW) structure.

16. The method of claim 12,
wherein the epitaxially growing of the light-emitting active region includes epitaxially growing quantum-well widths selected to provide a selected sub-band minimum energy potential, and
wherein the TB-GEMM structure includes an alloy composition such that metal current injectors have a Fermi energy potential that is substantially equal to the sub-band minimum energy potential of the multiple-quantum-well (MQW).

17. The method of claim 12, wherein the TB-GEMM structure is substantially lattice matched to the buffer layer.

18. The method of claim 11, wherein the TB-GEMM structure includes a plurality of layers.

19. The method of claim 12, wherein the buffer layer includes a plurality of layers.

20. A method comprising:
providing a substrate; and
forming a semiconductor structure on the substrate, the semiconductor structure including a multiple-quantum-well (MQW) structure facing adjacent a crystalline-metallic carrier-injection layer, wherein the carrier-injection layer has a Fermi energy potential substantially equal in value to a corresponding sub-band energy potential level of the MQW structure.

21. The method of claim 20, wherein the MQW structure is a light-emitting active structure.

22. The method of claim 20, wherein the forming of the semiconductor structure includes forming the MQW structure to include a plurality of quantum wells and an epitaxial tunneling-barrier (TB) between the plurality of quantum wells and the crystalline-metallic carrier-injection layer.

23. The method of claim 20, wherein the substrate includes a buffer layer, and wherein the forming of the semiconductor structure includes forming the semiconductor structure on the buffer layer of the substrate.

24. The method of claim 20, wherein the forming of the semiconductor structure includes forming the MQW structure to include a plurality of quantum wells, and an interfacial layer and an epitaxial tunneling-barrier (TB) between the plurality of quantum wells and the crystalline-metallic carrier-injection layer.

* * * * *